United States Patent
Harayama et al.

(10) Patent No.: US 9,140,997 B2
(45) Date of Patent: Sep. 22, 2015

(54) CONTROL APPARATUS, LITHOGRAPHY APPARATUS, AND METHOD OF MANUFACTURING ARTICLE

(71) Applicant: CANON KABUSHIKI KAISHA, Tokyo (JP)

(72) Inventors: Tomohiro Harayama, Utsunomiya (JP); Satoshi Akimoto, Utsunomiya (JP)

(73) Assignee: CANON KABUSHIKI KAISHA (JP)

( * ) Notice: Subject to any disclaimer, the term of this patent is extended or adjusted under 35 U.S.C. 154(b) by 281 days.

(21) Appl. No.: 13/846,137

(22) Filed: Mar. 18, 2013

(65) Prior Publication Data
US 2013/0265558 A1    Oct. 10, 2013

(30) Foreign Application Priority Data

Apr. 6, 2012    (JP) ................. 2012-087935

(51) Int. Cl.
  G03B 27/62    (2006.01)
  G03B 27/32    (2006.01)
  G03F 7/20     (2006.01)

(52) U.S. Cl.
  CPC ........ G03F 7/70591 (2013.01); G03F 7/70616 (2013.01)

(58) Field of Classification Search
  CPC ................. G03F 7/70591; G03F 7/70616
  USPC ........................... 355/72–76, 52, 53
  See application file for complete search history.

(56) References Cited

U.S. PATENT DOCUMENTS

| | | |
|---|---|---|
| 5,523,193 A | 6/1996 | Nelson |
| 2002/0156541 A1 | 10/2002 | Yutkowitz |
| 2005/0231706 A1* | 10/2005 | Yang et al. ............. 355/72 |
| 2005/0267609 A1* | 12/2005 | Van Donkelaar et al. ...... 700/45 |
| 2006/0087632 A1* | 4/2006 | Tousain ............. 355/53 |
| 2007/0182944 A1* | 8/2007 | Van De Biggelaar ........ 355/53 |
| 2009/0268185 A1 | 10/2009 | Vervoordeldonk et al. |

FOREIGN PATENT DOCUMENTS

| | | |
|---|---|---|
| CN | 101566854 A | 10/2009 |
| JP | 2009-237916 A | 10/2009 |

OTHER PUBLICATIONS

Notification of the First Office Action issued in corresponding Chinese Patent Application No. 201310106052, dated Mar. 24, 2015. English Translation provided.

* cited by examiner

*Primary Examiner* — Hung Henry Nguyen
(74) *Attorney, Agent, or Firm* — Rossi, Kimms & McDowell LLP

(57) ABSTRACT

The present invention provides a control apparatus including a feed-forward controller configured to perform feed-forward control of a controlled object, the apparatus being configured to obtain a first response data sequence of the controlled object measured by applying a first manipulated variable to the controlled object, and determining, assuming that a second response data sequence of the controlled object to be obtained if a second manipulated variable data sequence, obtained by respectively multiplying the first manipulated variable by gains as variables which can vary with time, is applied to the controlled object, is expressed as a linear combination of the first response data sequence with the gains as coefficients of the liner combination, the gains so that a discrepancy between the second response data sequence and a target data sequence falls within a tolerance.

10 Claims, 24 Drawing Sheets

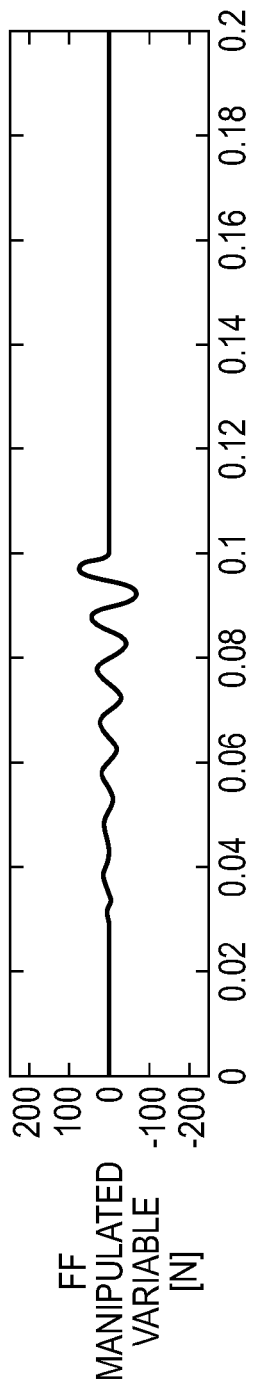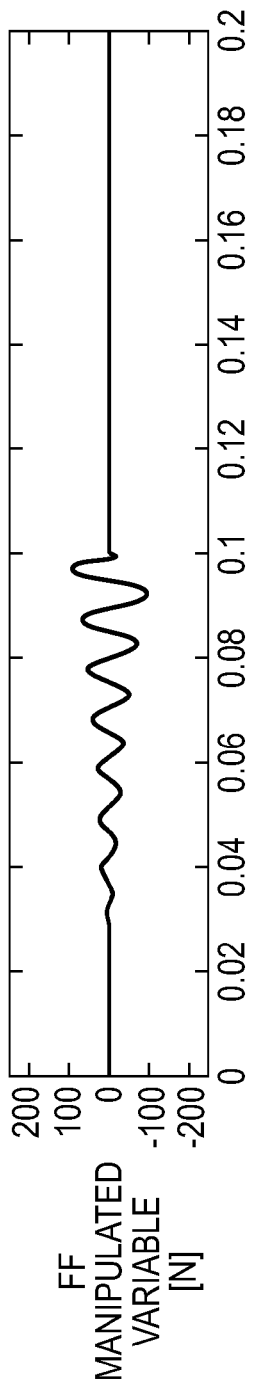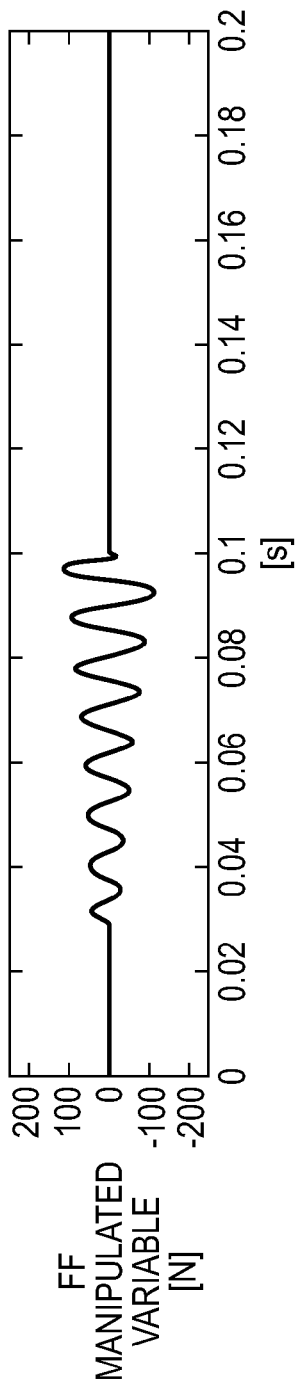

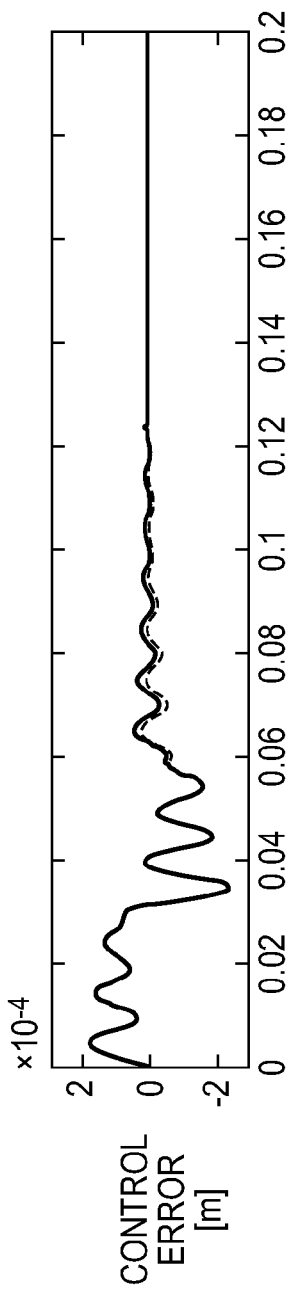
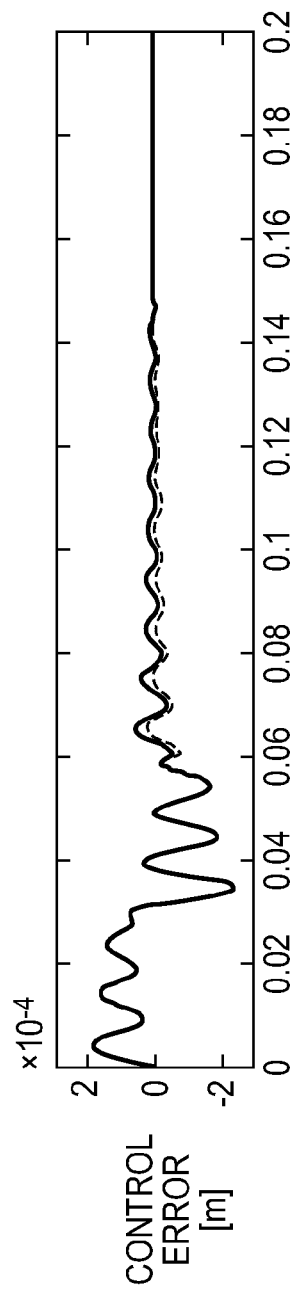
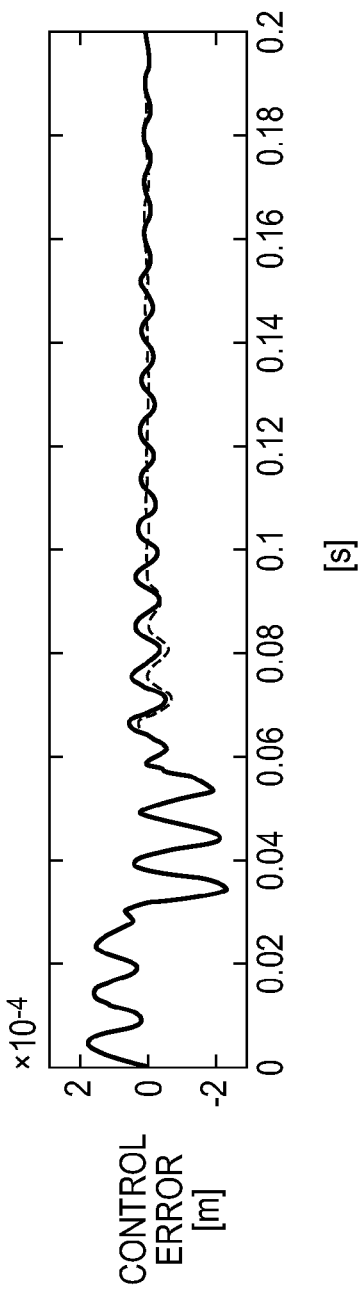
FIG. 10A
FIG. 10B
FIG. 10C

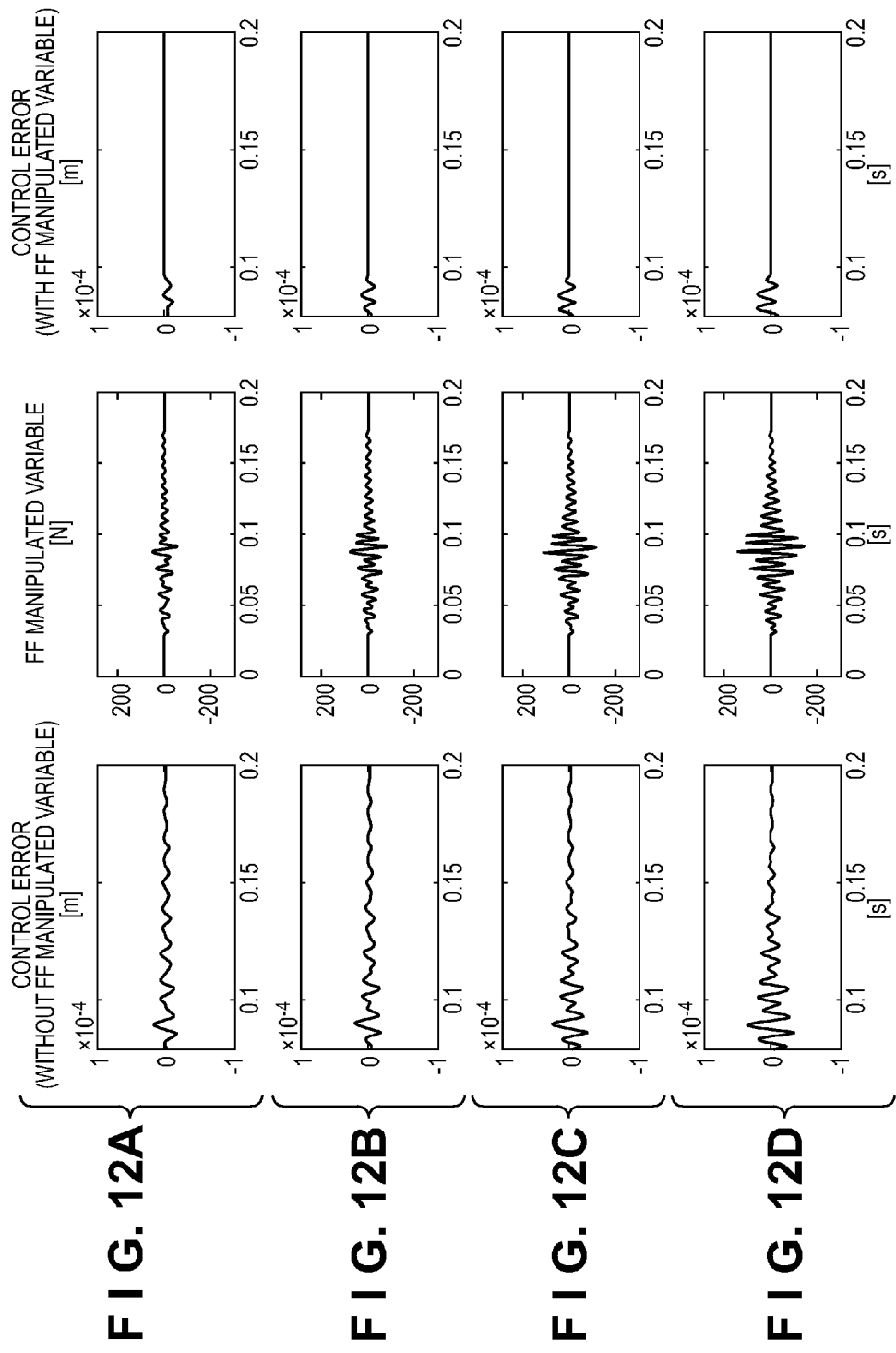

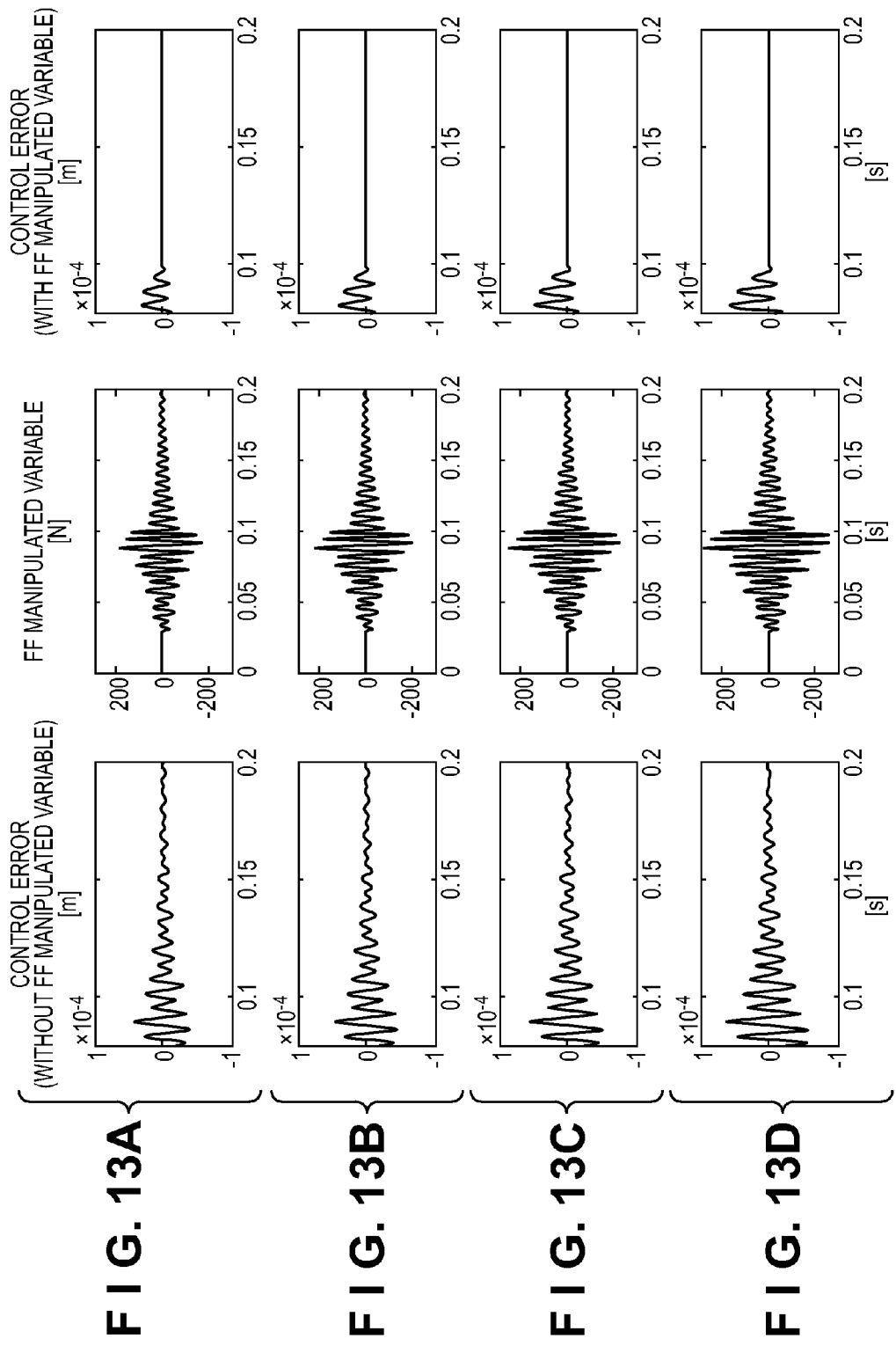
F I G. 13A
F I G. 13B
F I G. 13C
F I G. 13D

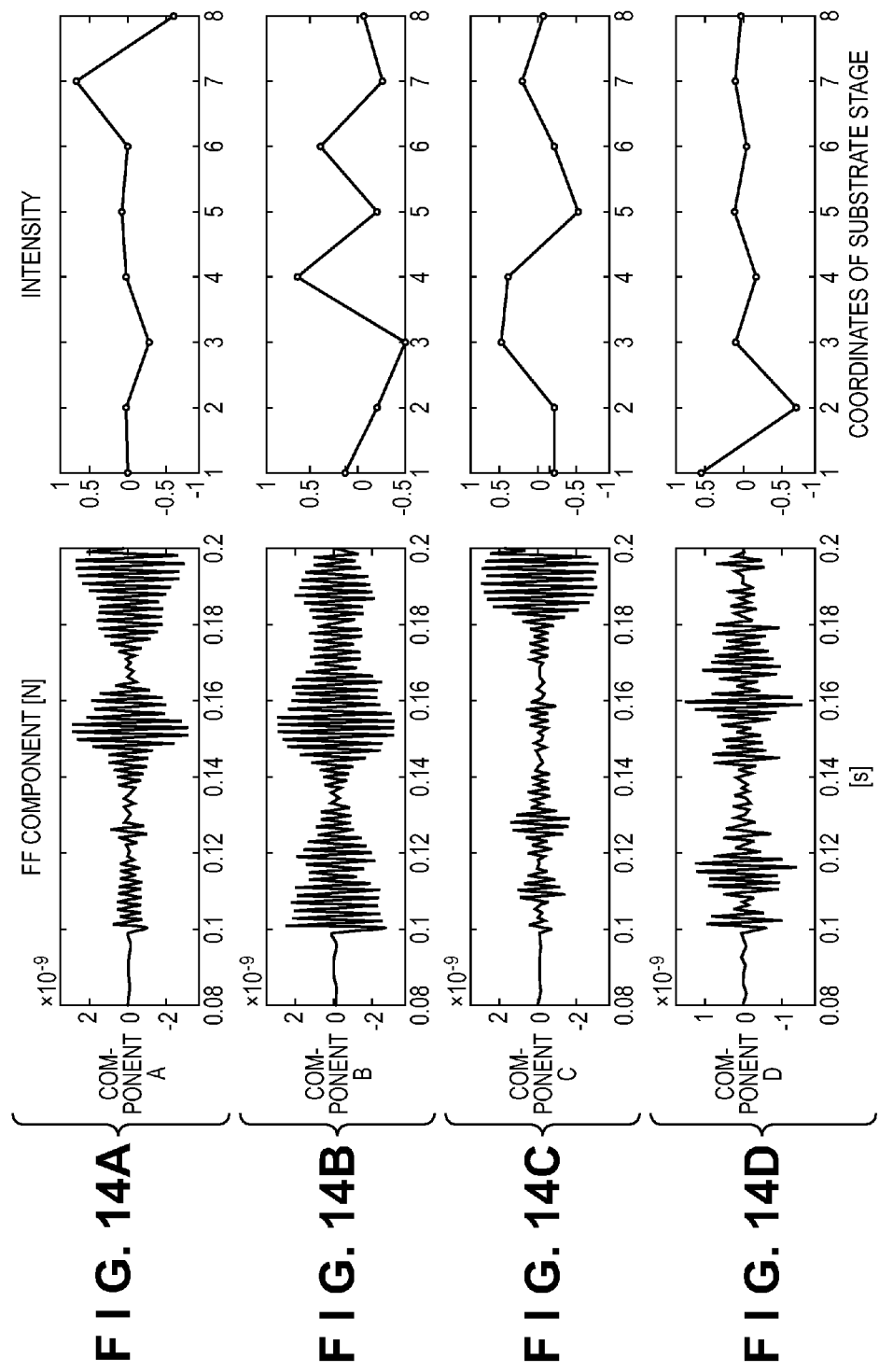

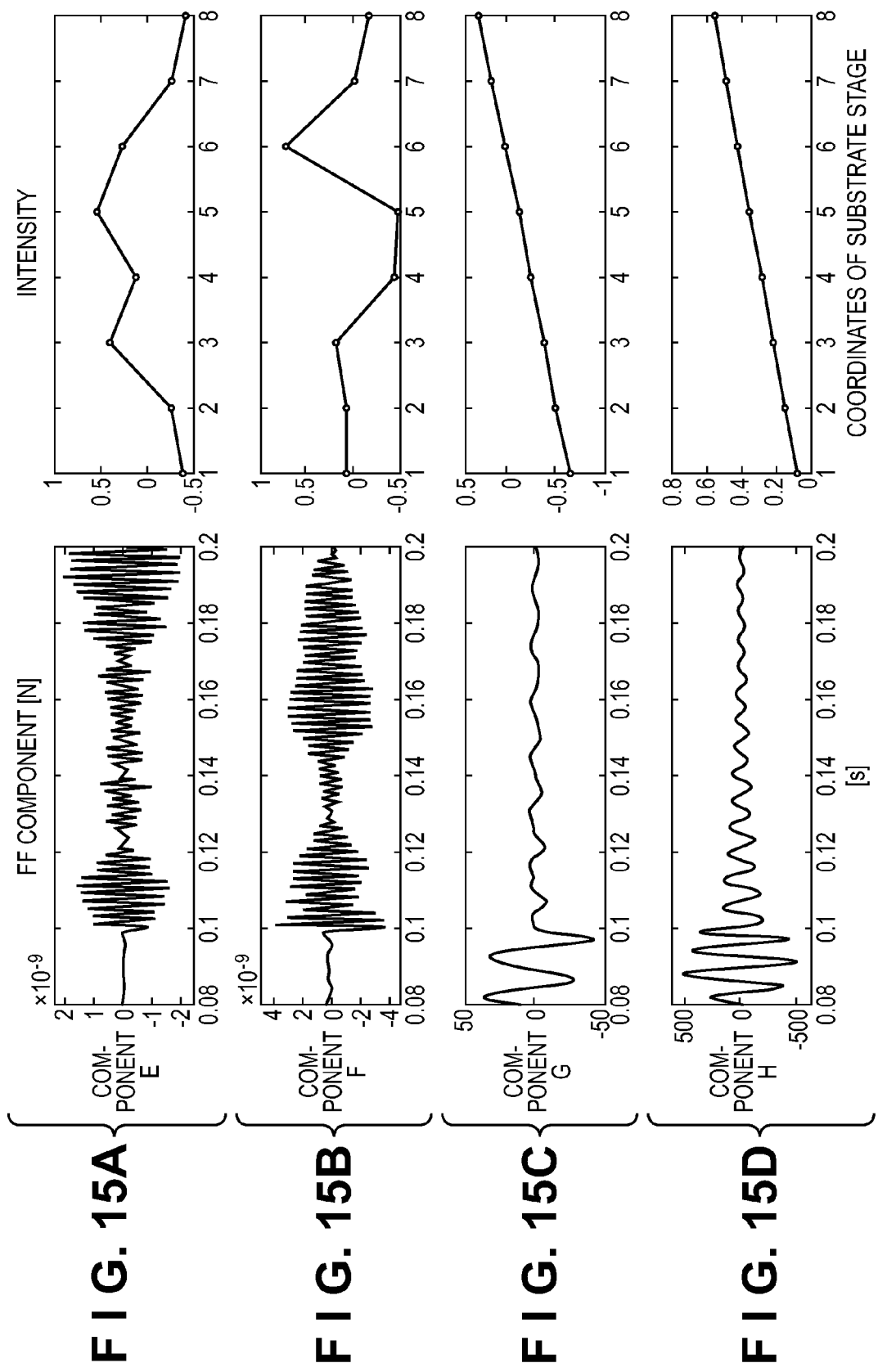

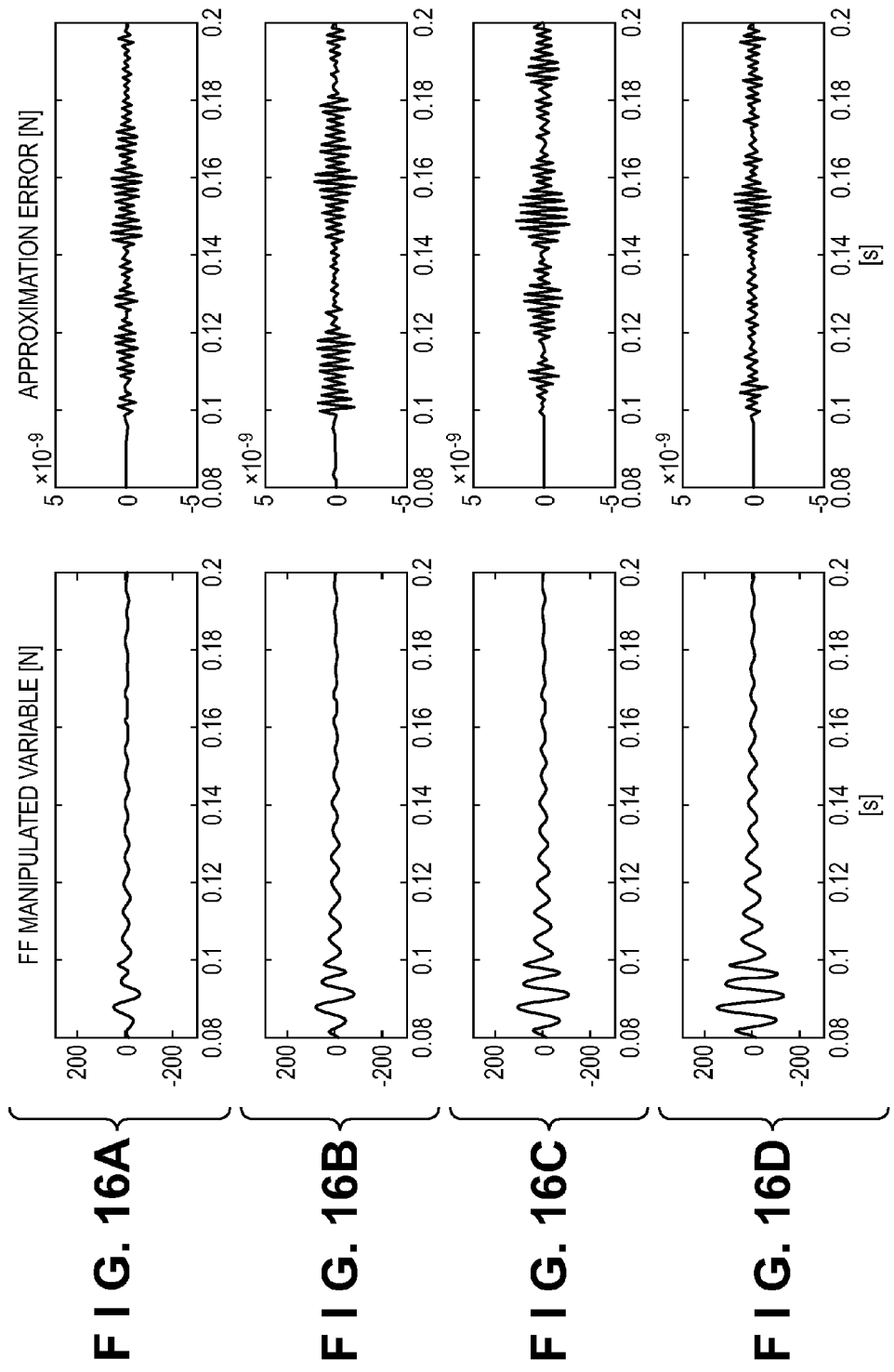

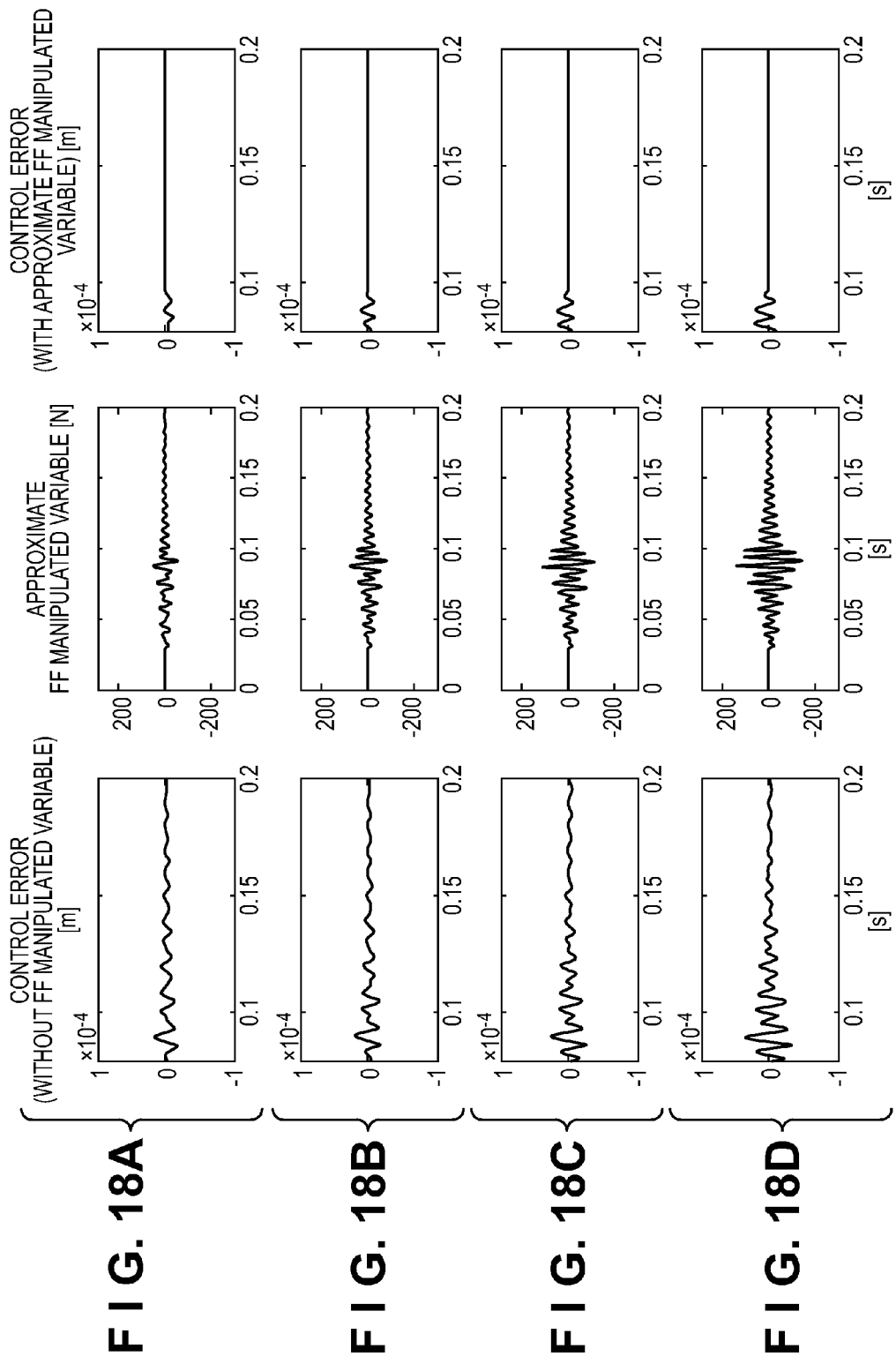
F I G. 18A
F I G. 18B
F I G. 18C
F I G. 18D

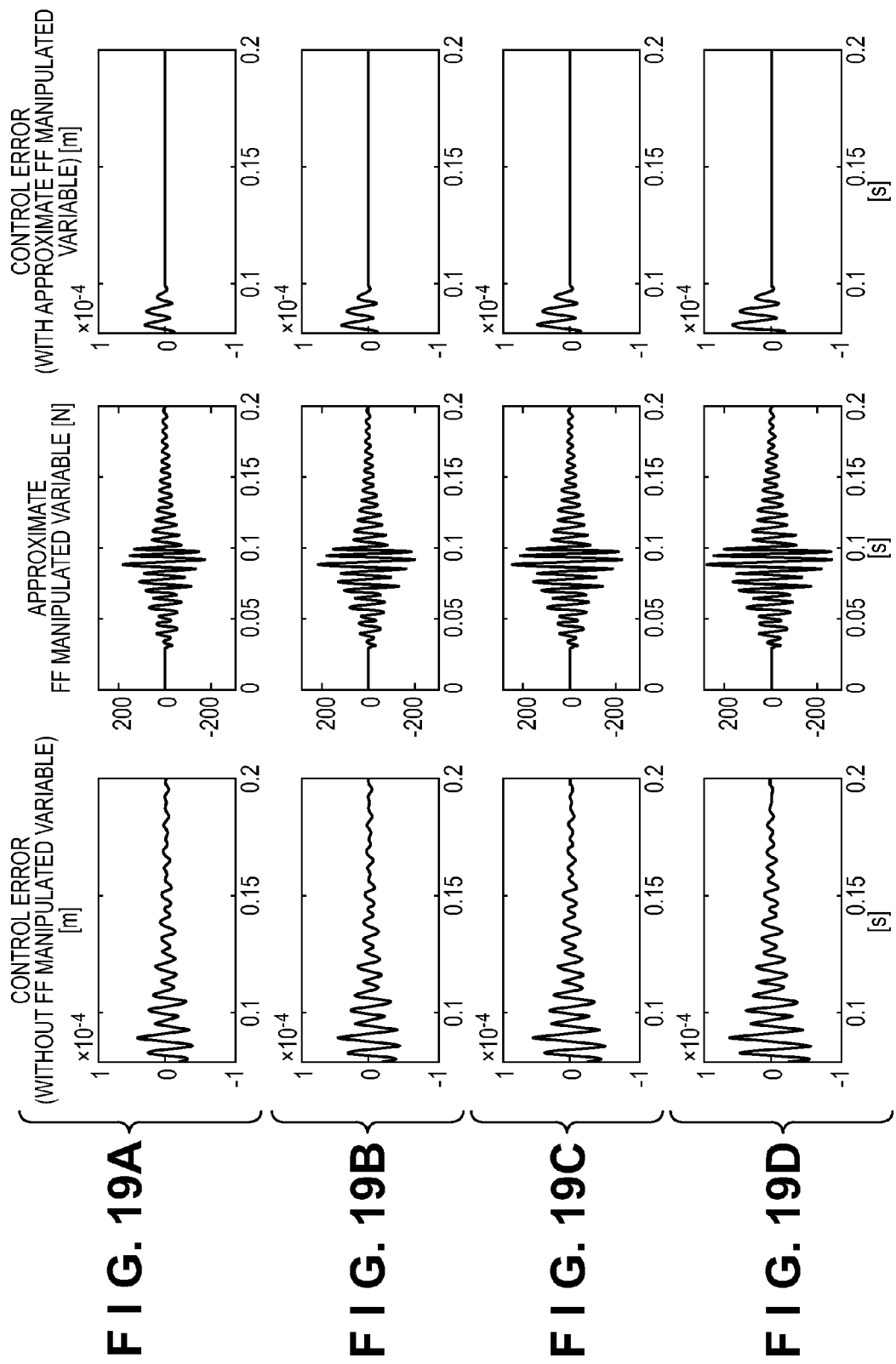

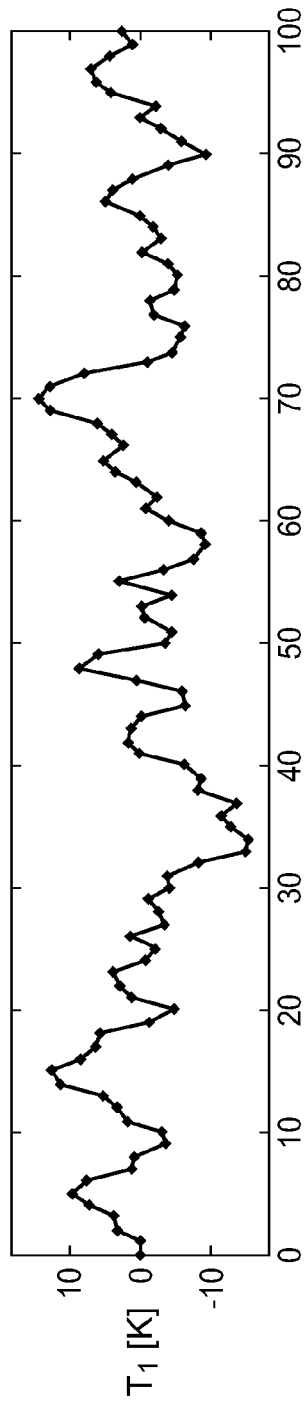
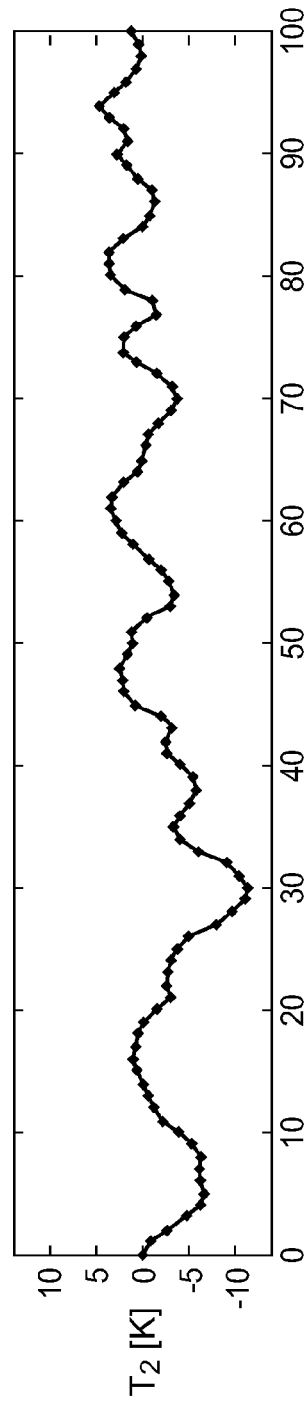
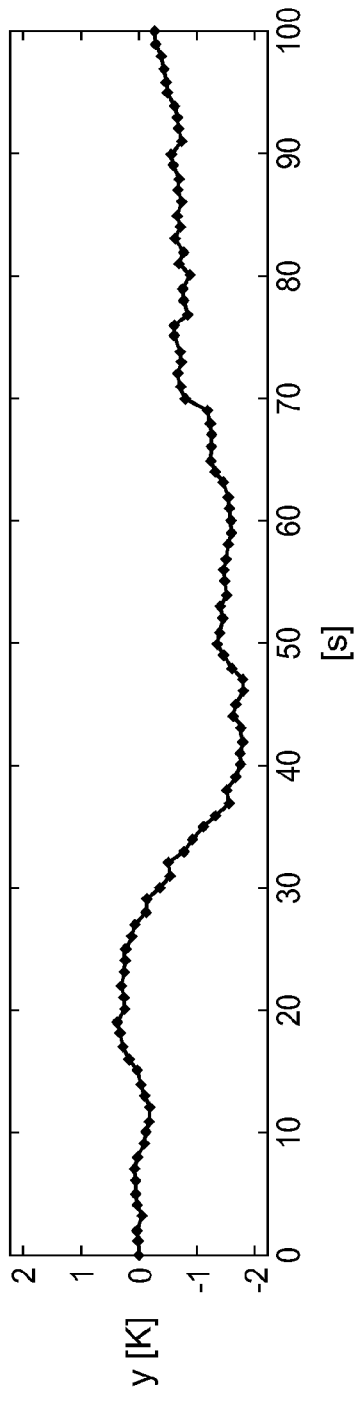
FIG. 21A
FIG. 21B
FIG. 21C

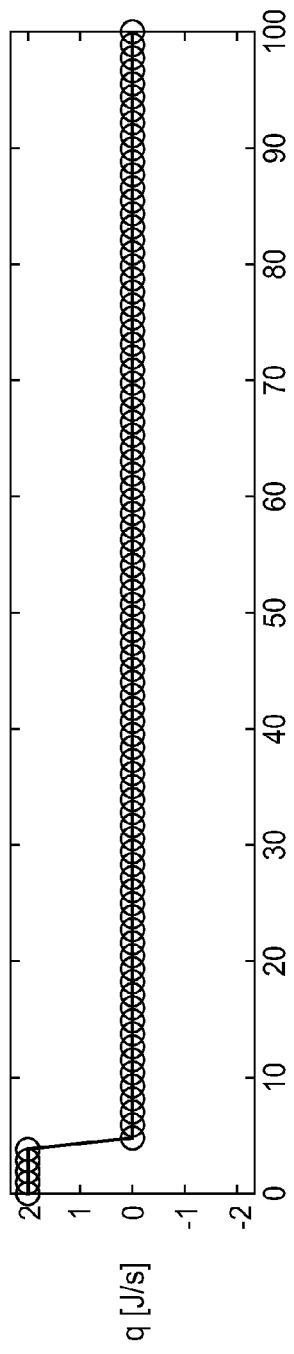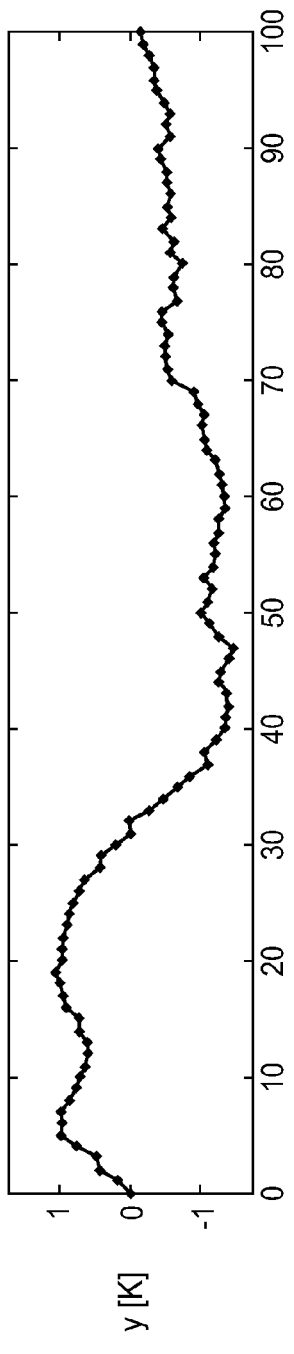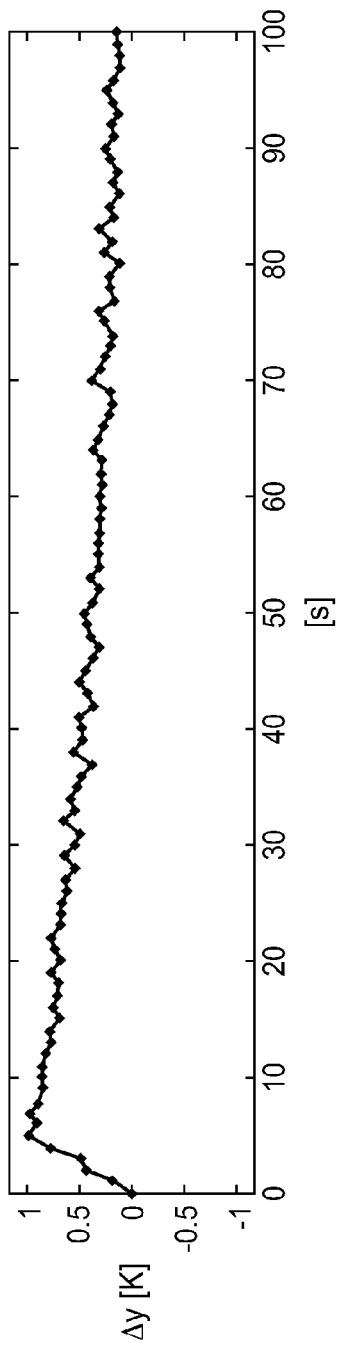

F I G. 24
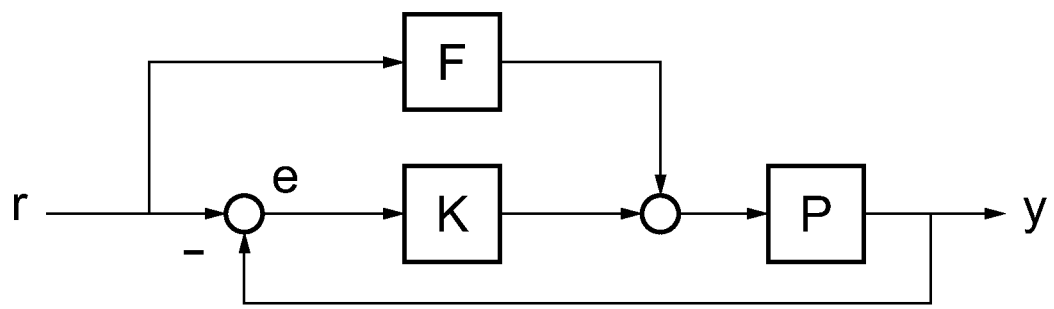

CONTROL APPARATUS, LITHOGRAPHY APPARATUS, AND METHOD OF MANUFACTURING ARTICLE

BACKGROUND OF THE INVENTION

1. Field of the Invention

The present invention relates to a control apparatus, a lithography apparatus, and a method of manufacturing an article.

2. Description of the Related Art

FIG. 24 is a block diagram of a typical 2-degrees-of-freedom control system. Referring to FIG. 24, a transfer function from an input (target value) r to an output (controlled variable) y is given by:

$$y = \left(\frac{KP}{1+KP} + \frac{FP}{1+KP}\right)r \qquad (1)$$

where the first term on the right side is a feedback (FB) term, and the second term on the right side is a feed-forward (FF) term. The difference between the target value r and the controlled variable y is a control error e, and the 2-degrees-of-freedom control system is intended to set the control error e to zero (bring the control error e close to zero).

Referring to equation (1), as is apparent from y=r for F=1/P, when the transfer function (FF gain) of an FF controller is defined as the inverse function of the transfer function (characteristic) of a controlled object, it is possible to attain an ideal target value response (a reduction in control error). In this manner, highly accurate modeling of the controlled object (highly accurate representation of the controlled object using a transfer function and numerical values) determines the performance of the target value response.

In modeling the controlled object, the controlled object is commonly known to be expressed as a polynomial of a Laplace operator s. As long as the controlled object can be accurately expressed as a polynomial of the Laplace operator s, its inverse function can also be expressed as a polynomial of the Laplace operator s, thus allowing optimum FF control. In the field of moving body control, it has been reported that the target value response is improved by FF of the first-order derivative (velocity) and second-order derivative (acceleration) of the target position (further, FF of the third-order derivative (jerk) and fourth-order derivative of the target position). However, it is difficult to express the characteristic of the controlled object as a polynomial of the Laplace operator s with perfect accuracy. Also, although not only a modeling technique which uses a polynomial of the Laplace operator s, but also various modeling techniques have been attempted earlier, the controlled object cannot be modeled with perfect accuracy in any of these modeling techniques, so it is impossible to prevent modeling errors.

A change in characteristic of the controlled object is one factor of the modeling errors. For example, in moving body control for moving a carrier, the characteristic of the controlled object changes depending on both the weight of a load and the state of a road surface. Japanese Patent Laid-Open No. 2009-237916 proposes a technique of preparing several models to select an appropriate model based on an actual response, instead of exclusively using one model for the controlled object, to cope with such a change in characteristic of the controlled object.

In a control system typified by a 2-degrees-of-freedom control system, the performance of a target value response depends on the accuracy of modeling the controlled object, as described above. Hence, as the performance required for the control system becomes higher, the controlled object needs to be modeled with a higher accuracy, so a considerable load is imposed on the modeling operation. A reduction in modeling error by the technique described in Japanese Patent Laid-Open No. 2009-237916 is constrained by models prepared in advance.

SUMMARY OF THE INVENTION

The present invention provides, for example, a control apparatus advantageous in terms of reduction of a control error.

According to one aspect of the present invention, there is provided a control apparatus including a feed-forward controller configured to perform feed-forward control of a controlled object, the apparatus being configured to obtain a first response data sequence of the controlled object measured by applying a first manipulated variable to the controlled object, and determining, assuming that a second response data sequence of the controlled object to be obtained if a second manipulated variable data sequence, obtained by respectively multiplying the first manipulated variable by gains as variables which can vary with time, is applied to the controlled object, is expressed as a linear combination of the first response data sequence with the gains as coefficients of the linear combination, the gains so that a discrepancy between the second response data sequence and a target data sequence falls within a tolerance, and the feed-forward controller is configured to generate a feed-forward manipulated variable data sequence for the controlled object based on the determined gains.

Further features of the present invention will become apparent from the following description of exemplary embodiments with reference to the attached drawings.

BRIEF DESCRIPTION OF THE DRAWINGS

FIGS. 9A to 9C are time-series graphs showing changes in the feed-forward manipulated variables, applied to the substrate stage, for each set of coordinates of the substrate stage, over time.

FIGS. 10A to 10C are time-series graphs showing changes in the control errors of the substrate stage over time when the feed-forward manipulated variables shown in FIGS. 9A to 9C, respectively, are applied to the substrate stage.

FIGS. 12A to 12D are time-series graphs showing changes in the control errors and feed-forward manipulated variables of the substrate stage for each of first four sets of coordinates of the substrate stage over time.

FIGS. 13A to 13D are time-series graphs showing changes in the control errors and feed-forward manipulated variables of the substrate stage for each of the remaining four sets of coordinates of the substrate stage over time.

FIGS. 14A to 14D are graphs showing the results of component decomposition of the feed-forward manipulated variables shown in FIGS. 12A to 12D, respectively, over time.

FIGS. 15A to 15D are graphs showing the results of component decomposition of the feed-forward manipulated variables shown in FIGS. 13A to 13D, respectively, over time.

FIGS. 16A to 16D are time-series graphs showing changes in the results of approximating the feed-forward manipulated variables, and the approximation errors generated upon the approximation of the feed-forward manipulated variables, for each set of coordinates of the substrate stage, over time.

FIGS. 18A to 18D are time-series graphs showing changes in the control errors and approximate feed-forward manipulated variables of the substrate stage, for each of first four sets of coordinates of the substrate stage, over time.

FIGS. 19A to 19D are time-series graphs showing changes in the control errors and approximate feed-forward manipulated variables of the substrate stage, for each of the remaining four sets of coordinates of the substrate stage, over time.

FIGS. 21A to 21C are graphs showing changes in temperature of objects and a controlled object, respectively, over time when the temperature control system shown in FIG. 20 performs a given operation.

FIGS. 22A to 22C are time-series graphs showing changes in the reference heat flow rate applied to the controlled object, and the temperature and a change in temperature of the controlled object over time when the reference heat flow rate is applied to the controlled object, respectively.

FIG. 24 is a block diagram of a 2-degrees-of-freedom control system.

DESCRIPTION OF THE EMBODIMENTS

Figure 1:
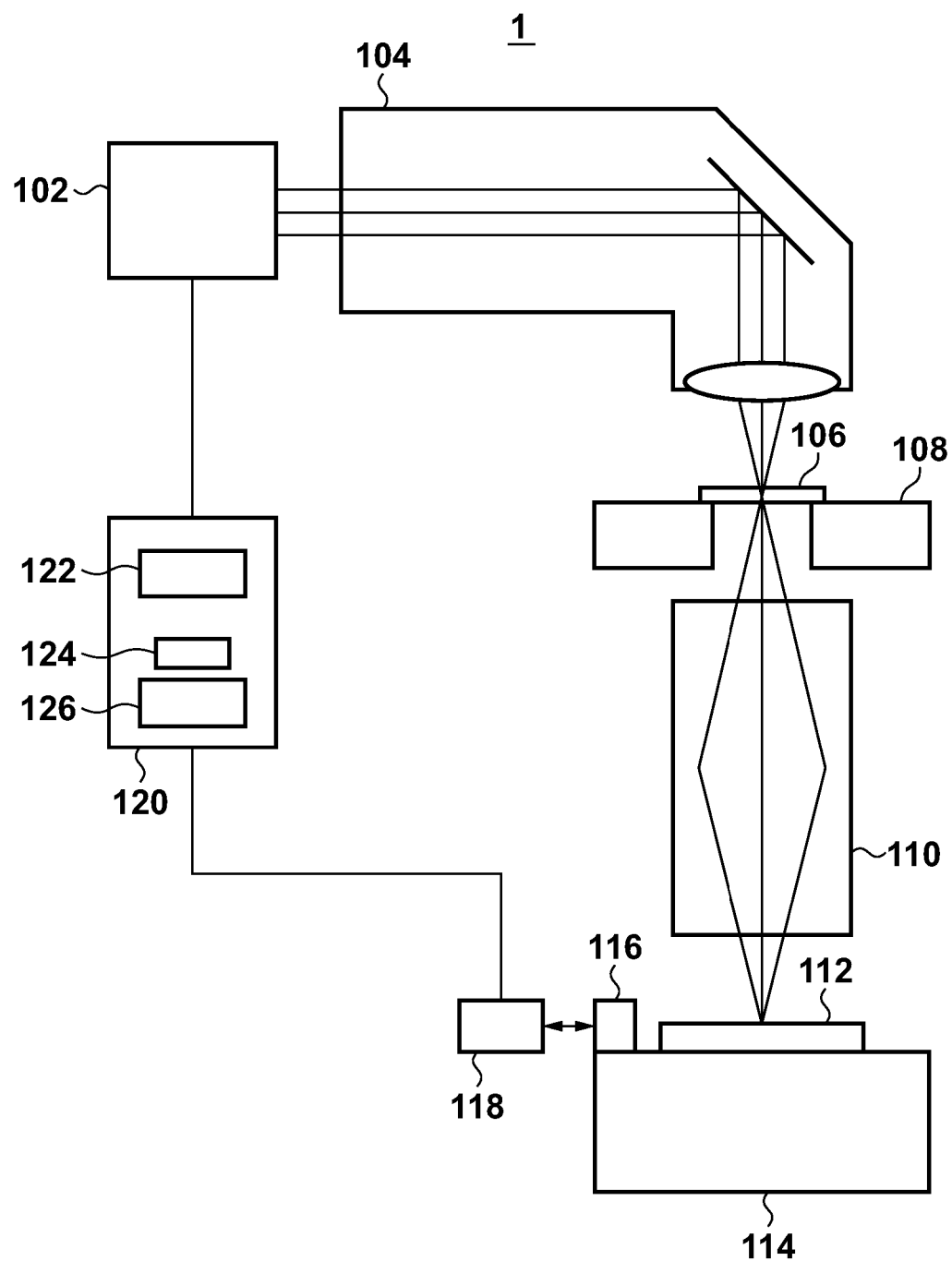
FIG. 1 is a schematic view showing the configuration of an exposure apparatus according to an aspect of the present invention.

Preferred embodiments of the present invention will be described below with reference to the accompanying drawings. Note that the same reference numerals denote the same members throughout the drawings, and a repetitive description thereof will not be given.

First Embodiment

FIG. 1 is a schematic view showing the configuration of an exposure apparatus 1 according to an aspect of the present invention. The exposure apparatus 1 serves as a lithography apparatus which transfers the pattern of a mask (original) onto a substrate by the step-and-scan scheme. However, the exposure apparatus 1 can also adopt the step-and-repeat scheme or other exposure schemes.

The exposure apparatus 1 includes an illumination optical system 104 which illuminates a mask 106 with light from a light source 102, a mask stage 108 which moves upon holding the mask 106, and a projection optical system 110 which projects the pattern of the mask 106 onto a substrate 112. The exposure apparatus 1 also includes a substrate stage 114 which moves upon holding the substrate 112, a moving mirror 116, a laser interferometer 118, and a control device (control apparatus) 120.

The light source 102 uses an excimer laser such as a KrF excimer laser having a wavelength of about 248 nm, or an ArF excimer laser having a wavelength of about 193 nm. However, the types and number of light sources 102 are not particularly limited, and an $F_2$ laser having a wavelength of about 157 nm, for example, may be used as the light source 102.

The illumination optical system 104 illuminates the mask 106 with light from the light source 102. The illumination optical system 104 includes, for example, a beam shaping optical system which shapes light from the light source 102, and an optical integrator which forms a large number of secondary light sources for illuminating the mask 106 with a uniform illuminance distribution.

The mask 106 has a pattern to be transferred onto the substrate 112, and is held and driven by the mask stage 108. Light diffracted by the mask 106 (its pattern) is projected onto the substrate 112 via the projection optical system 110. The mask 106 and substrate 112 are arranged in an optically conjugate relationship. Since the exposure apparatus 1 is a step-and-scan exposure apparatus, it transfers the pattern of the mask 106 onto the substrate 112 by synchronously scanning them.

The mask stage 108 includes a mask chuck for holding the mask 106 (chucking it by suction), and is movable in the X-, Y-, and Z-directions and rotation directions about the respective axes. Note that the scanning direction of the mask 106 or substrate 112 within its plane is defined as the Y-axis, a direction perpendicular to this scanning direction is defined as the X-axis, and a direction perpendicular to the plane of the mask 106 or substrate 112 is defined as the Z-axis.

The projection optical system 110 projects the pattern of the mask 106 onto the substrate 112. The projection optical system 110 can use a dioptric system, a catadioptric system, or a catoptric system.

The substrate 112 is a substrate onto which the pattern of the mask 106 is projected (transferred). The substrate 112 is coated with a resist (photosensitive agent). The substrate 112 includes a wafer, glass plate, and other substrates.

The substrate stage 114 includes a substrate chuck for holding the substrate 112 (chucking it by suction), and is movable in the X-, Y-, and Z-directions and rotation directions about the respective axes. The moving mirror 116 is fixed to the substrate stage 114, and used to detect the position and velocity of the substrate stage 114 by the laser interferometer 118. The substrate stage 114 functions as an adjusting device which adjusts the state of the substrate 112 in cooperation with the control device 120.

The control device 120 controls the operation of the (overall) exposure apparatus 1. The control device 120 controls operations associated with, for example, synchronous scanning of the mask stage 108 and substrate stage 114. In this embodiment, the control device 120 includes a feed-forward controller 122 and feedback controller 124 which use the substrate stage 114 as a controlled object, and a memory 126, and controls the substrate stage 114. The feed-forward controller 122 applies a feed-forward manipulated variable to the substrate stage 114 as the controlled object to perform feed-forward control of the substrate stage 114 so that the output response of the substrate stage 114 has a target value (target data). The feedback controller 124 performs feedback control of the substrate stage 114 so as to reduce the error between the output response of the substrate stage 114 and the target value. The memory 126 is a storage unit which stores data associated with control of the substrate stage 114. In this embodiment, especially the memory 126 stores, for example, the feed-forward manipulated variable applied from the feed-forward controller 122 to the substrate stage 114. The control device 120 and, more specifically, control of the substrate stage 114 by the feed-forward controller 122 will be described below.

Figure 2A:
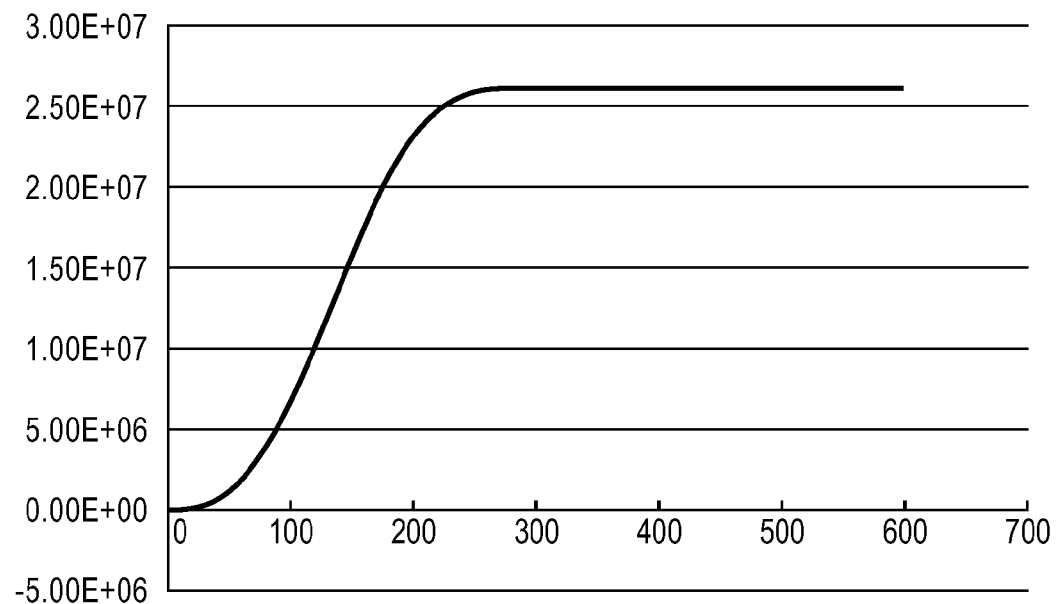
FIGS. 2A and 2B are time-series graphs showing changes in the position and control error, respectively, of a substrate stage over time.
Figure 2B:
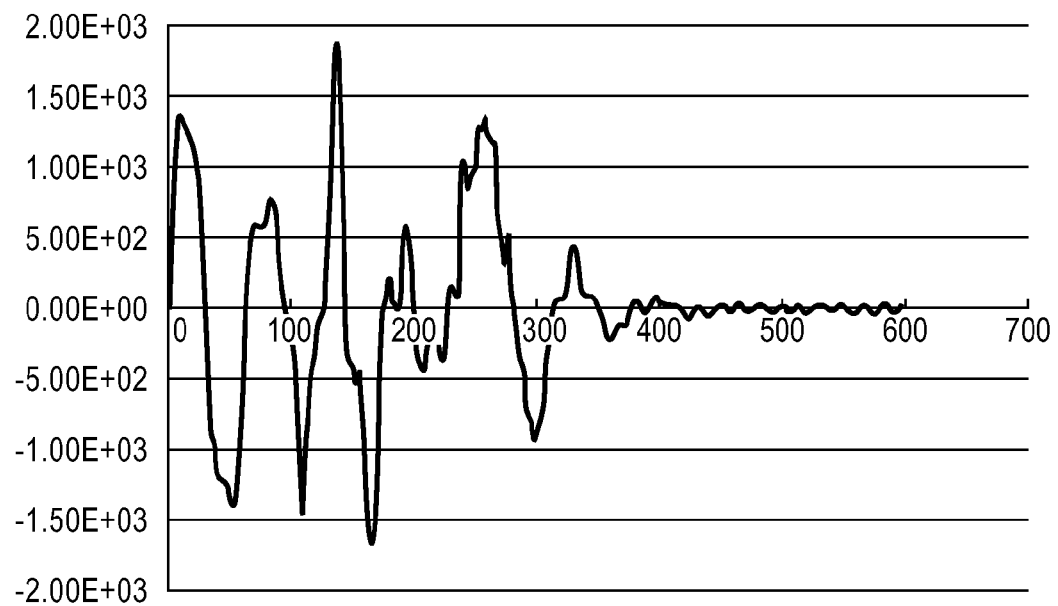

FIG. 2A is a time-series graph showing changes in the position of the substrate stage 114 over time. FIG. 2B is a time-series graph showing changes in the control error of the substrate stage 114 (that is, the shift between the position of the substrate stage 114 and the target position (target value)) over time. FIG. 2A shows the position of the substrate stage 114 on the ordinate, and time on the abscissa. Also, FIG. 2B shows the control error of the substrate stage 114 on the ordinate, and time on the abscissa.

As can be seen from FIG. 2A, the substrate stage 114 starts to move at time 0, and reaches the target position around time 300. However, as shown in FIG. 2B, around time 300, a large control error of the substrate stage 114 remains, so the substrate stage 114 does not completely reach the target position. An exposure apparatus for manufacturing a semiconductor device is required to align a substrate stage on the order of nanometers. Hence, in this case, the time at which an exposure process can be started is that subsequent to time 450 at which the control error of the substrate stage 114 settles.

Figure 3A:
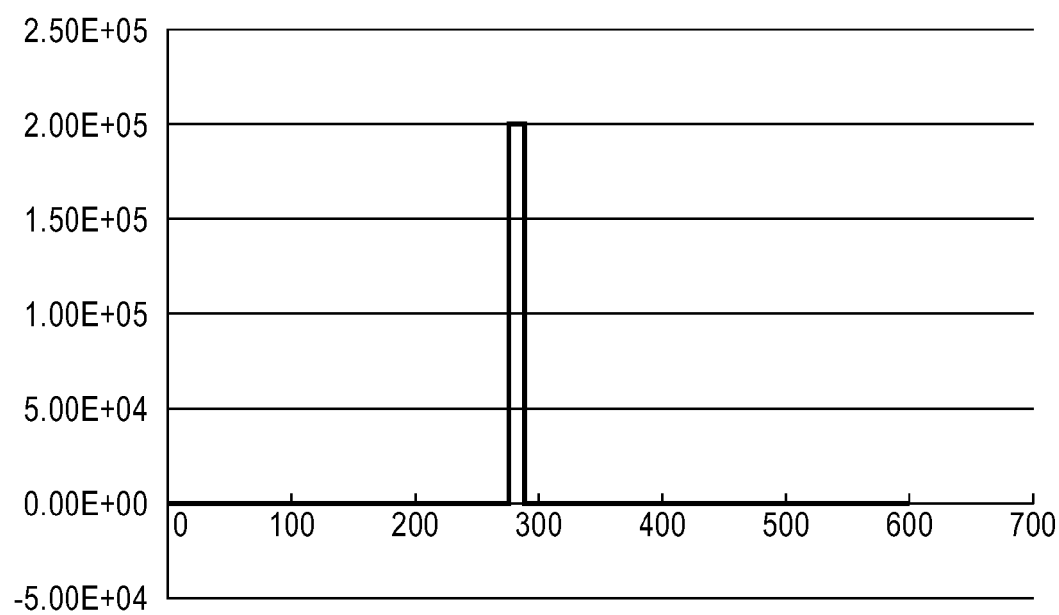
FIGS. 3A and 3B are time-series graphs showing changes in the feed-forward manipulated variable applied to the substrate stage, and the response of the substrate stage, respectively, over time.
Figure 3B:
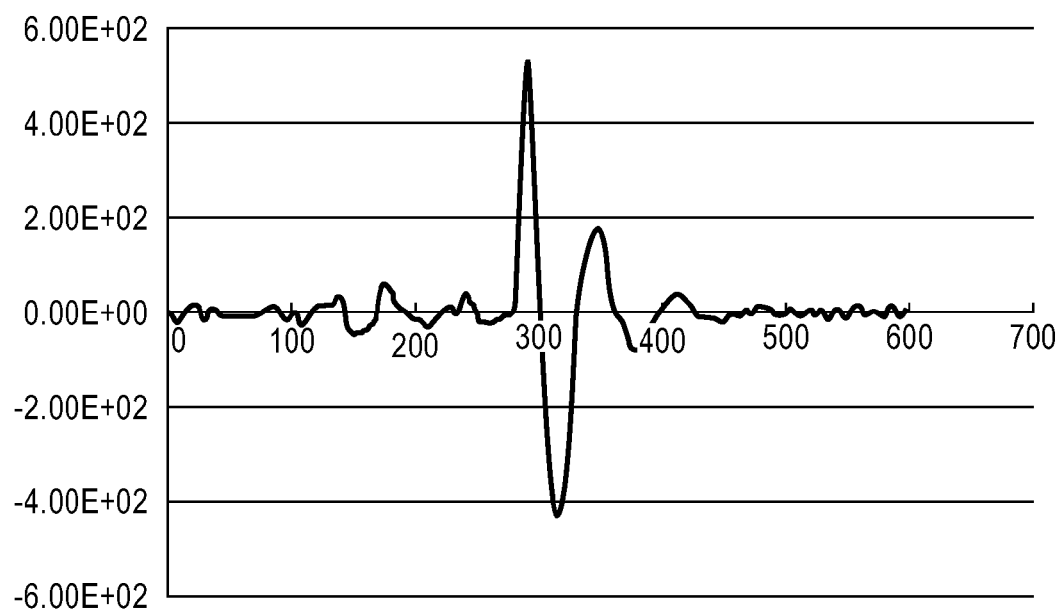

FIG. 3A is a time-series graph showing changes in the feed-forward (FF) manipulated variable (first manipulated variable), applied to the substrate stage 114, over time. FIG. 3B is a time-series graph showing changes in the response (first response data sequence) of the substrate stage 114 over time when it is applied with the FF manipulated variable shown in FIG. 3A. FIG. 3A shows the FF manipulated variable on the ordinate, and time on the abscissa. Also, FIG. 3B shows the response of the substrate stage 114 on the ordinate, and time on the abscissa.

As can be seen from FIGS. 3A and 3B, when an FF manipulated variable represented by a rectangular wave around time 280 is applied to the substrate stage 114, the substrate stage 114 shows an impulse response reaction (response characteristic) at the same time. The FF manipulated variable and response shown in FIGS. 3A and 3B, respectively, have actual measurement values measured (actually measured) by the laser interferometer 118 or a sensor (not shown) which detects the manipulated variable applied to the substrate stage 114.

Figure 4A:
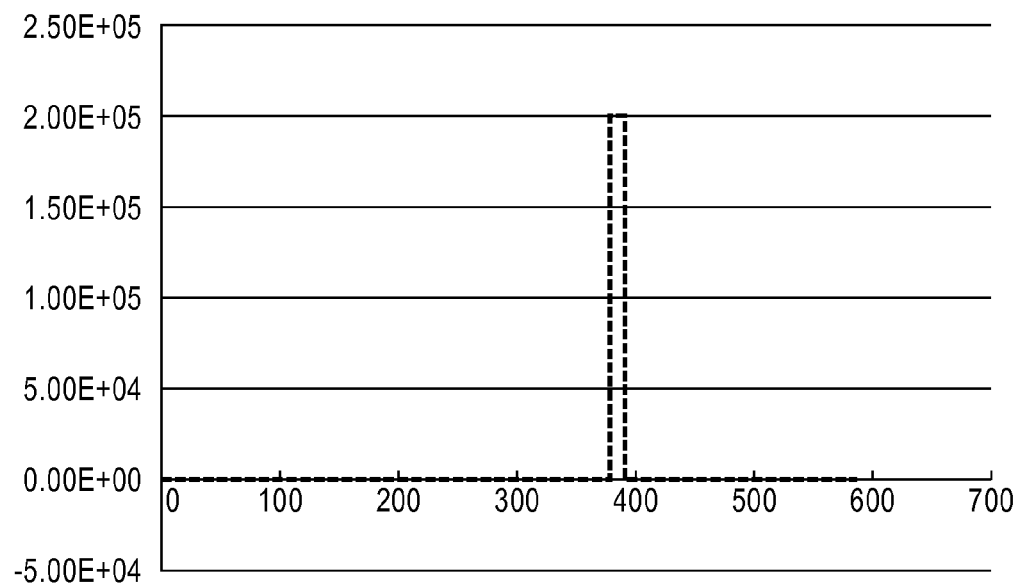
FIGS. 4A and 4B are time-series graphs showing changes in the feed-forward manipulated variable virtually applied to the substrate stage, and the virtual response of the substrate stage, respectively, over time.
Figure 4B:
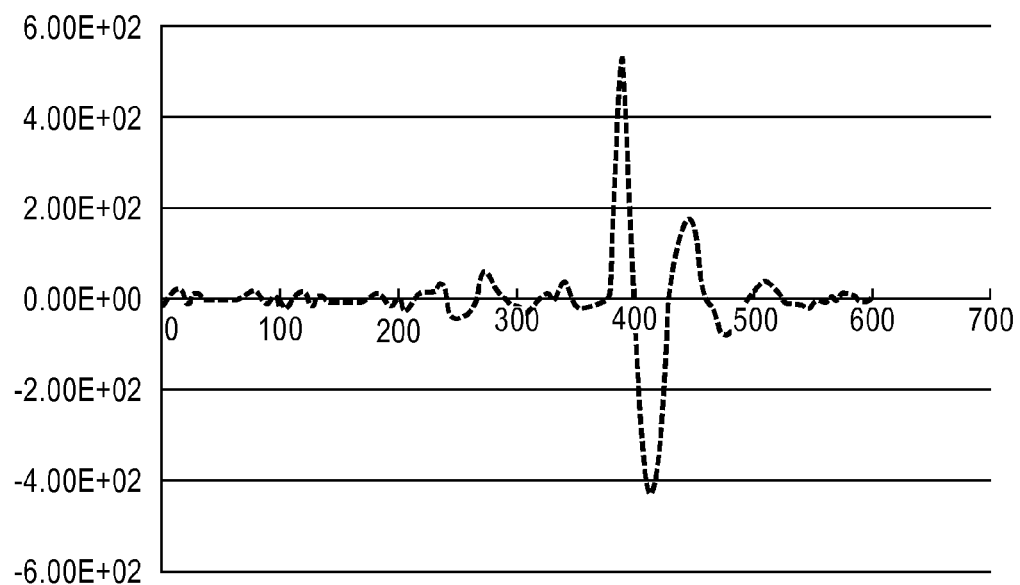

FIG. 4A is a time-series graph showing changes in the FF manipulated variable, virtually applied to the substrate stage 114, over time. FIG. 4B is a time-series graph showing changes in the virtual response of the substrate stage 114 over time when it is applied with the virtual FF manipulated variable shown in FIG. 4A. FIG. 4A shows the FF manipulated variable on the ordinate, and time on the abscissa. Also, FIG. 4B shows the response of the substrate stage 114 on the ordinate, and time on the abscissa.

The case wherein the FF manipulated variable shown in FIG. 3A is virtually applied to the substrate stage 114 at time 380 that is time 100 later than time 280, as shown in FIG. 4A, will be considered. In this case, a virtual response that is time 100 later than the response of the substrate stage 114, shown in FIG. 3B, is obtained as a response of the substrate stage 114, as shown in FIG. 4B. This is because the manipulated variable applied to the substrate stage 114, and the response of the substrate stage 114 are assumed to have a linear relationship, that is, the response characteristic of the substrate stage 114 is assumed to always remain the same. In other words, the response shown in FIG. 3B is assumed to be obtained at time 380 when the FF manipulated variable shown in FIG. 3A is applied to the substrate stage 114 at time 380.

Letting $\Delta f(t)$ be the FF manipulated variable shown in FIG. 3A, and $\Delta y(t)$ be the response shown in FIG. 3B, the FF manipulated variable shown in FIG. 4A can be expressed as $\Delta f(t-100)$, and the response shown in FIG. 4B can be expressed as $\Delta y(t-100)$. Although a virtual response of the substrate stage 114 at time 380 is obtained based on a response (actual measurement value) of the substrate stage 114 at time 280 in this embodiment, virtual responses of the substrate stage 114 can similarly be obtained at times 281, 282, ..., 280+n.

The gain (magnitude) of the FF manipulated variable applied to the substrate stage 114, and a response of the substrate stage 114 to this gain will be considered next. Note that the gain is a variable which can vary with time. In this embodiment, a response $\Delta y(t)$ to the FF manipulated variable $\Delta f(t)$ is measured, as described above. Hence, as long as the manipulated variable applied to the substrate stage 114, and the response of the substrate stage 114 have a linear relationship, a response (second response data sequence) $g\Delta y(t)$ to a manipulated variable (second manipulated variable data sequence) $g\Delta f(t)$ is expected to be obtained. The same holds true when the time at which an FF manipulated variable is applied has shifted, so a response $g100\Delta y(t-100)$ to an FF manipulated variable $g100\Delta f(t-100)$ is expected to be obtained.

Control of the substrate stage 114 by the feed-forward controller 122 will be described in more detail below, together with the flow of actual data, based on the concept of the present invention described earlier.

First, the result (actual measurement value) of measuring a control error $e(t)$ of the substrate stage 114 is obtained while no FF manipulated variable is applied to the substrate stage 114. The time interval in which an exposure process is performed (times 331 to 420 in this embodiment) is determined, and control error data in the time interval of an exposure process is extracted from the control error $e(t)$. At this time, assuming the sampling time as 1, 90 samples of control error data $e_0$ are extracted in accordance with:

$$e_0 = [e_1\ e_2 \ldots e_{90}]_T \qquad (2)$$

An FF manipulated variable $\Delta f(t)$ is applied to the substrate stage 114 at a given time, and the result (actual measurement value) of measuring a response $\Delta y(t)$ to it is obtained, as shown in FIGS. 3A and 3B. Response data in the time interval of an exposure process is extracted from the response $\Delta y(t)$ of the substrate stage 114. Response data $y_0$ extracted in this way is described by:

$$y_0 = [y_{1,0}\ y_{2,0} \ldots y_{90,0}]_T \qquad (3)$$

An actual measurement value is obtained as data in the above case, while virtual data is generated in the following case. A similar response is assumed to be obtained when a similar FF manipulated variable is applied to the substrate stage 114 after one sample applied with the FF manipulated variable $\Delta f(t)$ is obtained, and the obtained response is defined as $y_1$. Similarly, when a response after two samples, that after three samples, ..., and that after n samples are defined as $y_2, y_3, \ldots, y_n$, we have:

$$[y_0 \ y_1 \ \cdots \ y_n] = \begin{bmatrix} y_{1,0} & y_{1,1} & \cdots & y_{1,n} \\ y_{2,0} & y_{2,1} & \cdots & y_{2,n} \\ \vdots & \vdots & \ddots & \vdots \\ y_{90,0} & y_{90,1} & \cdots & y_{90,n} \end{bmatrix} \quad (4)$$

As described above, when the controlled object (substrate stage 114) is linear, a response to the FF manipulated variable $g\Delta f(t)$ is expressed as $g\Delta y(t)$. Hence, letting $g_n$ be the gain of the FF manipulated variable after n samples, we have:

$$[g_0 y_0 \ g_1 y_1 \ \cdots \ g_n y_n] = \begin{bmatrix} g_0 y_{1,0} & g_1 y_{1,1} & \cdots & g_n y_{1,n} \\ g_0 y_{2,0} & g_1 y_{2,1} & \cdots & g_n y_{2,n} \\ \vdots & \vdots & \ddots & \vdots \\ g_0 y_{90,0} & g_1 y_{90,1} & \cdots & g_n y_{90,n} \end{bmatrix} \quad (5)$$

A response of the substrate stage 114 when all the FF manipulated variables after n samples are applied to the substrate stage 114 is estimated. When response data in the time interval of an exposure process, which is extracted from that response, is defined as Y, the response data Y is the sum of n responses. Then, we have:

$$Y = \begin{bmatrix} Y_1 \\ Y_2 \\ \vdots \\ Y_{90} \end{bmatrix} \quad (6)$$

$$= \begin{bmatrix} g_0 y_{1,0} + g_1 y_{1,1} + \ldots + g_n y_{1,n} \\ g_0 y_{2,0} + g_1 y_{2,1} + \ldots + g_n y_{2,n} \\ \vdots \\ g_0 y_{90,0} + g_1 y_{90,1} + \ldots + g_n y_{90,n} \end{bmatrix}$$

$$= \begin{bmatrix} y_{1,0} & y_{1,1} & \cdots & y_{1,n} \\ y_{2,0} & y_{2,1} & \cdots & y_{2,n} \\ \vdots & \vdots & \ddots & \vdots \\ y_{90,0} & y_{90,1} & \cdots & y_{90,n} \end{bmatrix} \begin{bmatrix} g_0 \\ g_1 \\ \vdots \\ g_n \end{bmatrix}$$

To eliminate the control error (control error data $e_0$) in the time interval of an exposure process by applying the FF manipulated variable to the substrate stage 114, the response data Y need only be equal to the control error data $e_0$. Therefore, the gain $g_n$ of the FF manipulated variable is obtained (determined) using a pseudo-inverse matrix as given by:

$$e_0 = Y \quad (7)$$

$$\begin{bmatrix} e_0 \\ e_1 \\ \vdots \\ e_{90} \end{bmatrix} = \begin{bmatrix} y_{1,0} & y_{1,1} & \cdots & y_{1,n} \\ y_{2,0} & y_{2,1} & \cdots & y_{2,n} \\ \vdots & \vdots & \ddots & \vdots \\ y_{90,0} & y_{90,1} & \cdots & y_{90,n} \end{bmatrix} \begin{bmatrix} g_0 \\ g_1 \\ \vdots \\ g_n \end{bmatrix}$$

-continued $$\begin{bmatrix} g_0 \\ g_1 \\ \vdots \\ g_n \end{bmatrix} = \begin{bmatrix} y_{1,0} & y_{1,1} & \cdots & y_{1,n} \\ y_{2,0} & y_{2,1} & \cdots & y_{2,n} \\ \vdots & \vdots & \ddots & \vdots \\ y_{90,0} & y_{90,1} & \cdots & y_{90,n} \end{bmatrix}^{-1} \begin{bmatrix} e_0 \\ e_1 \\ \vdots \\ e_{90} \end{bmatrix}$$

Figure 5A:
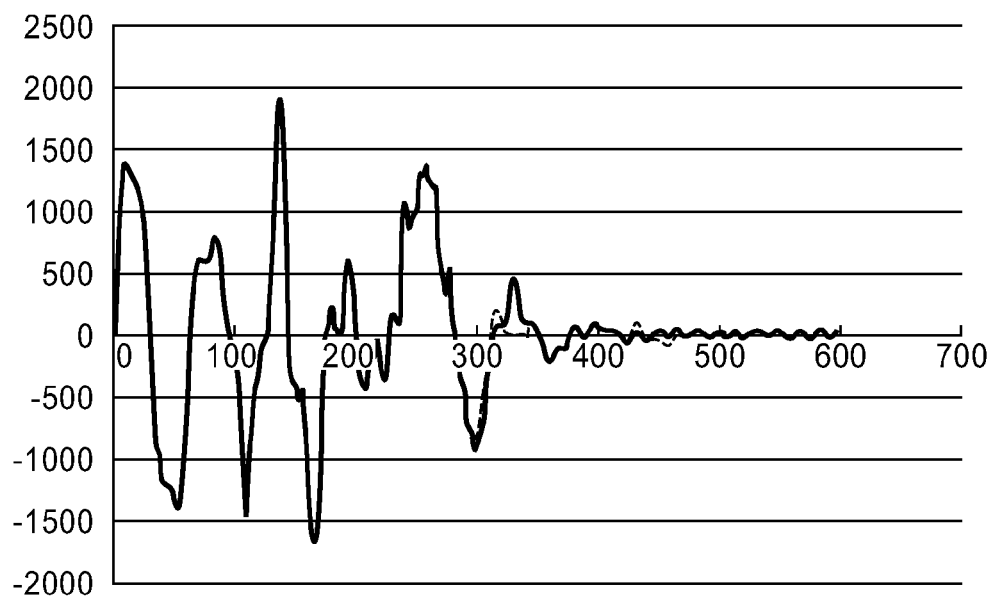
FIGS. 5A and 5B are time-series graphs showing changes in the control errors of the substrate stage over time.
Figure 5B:
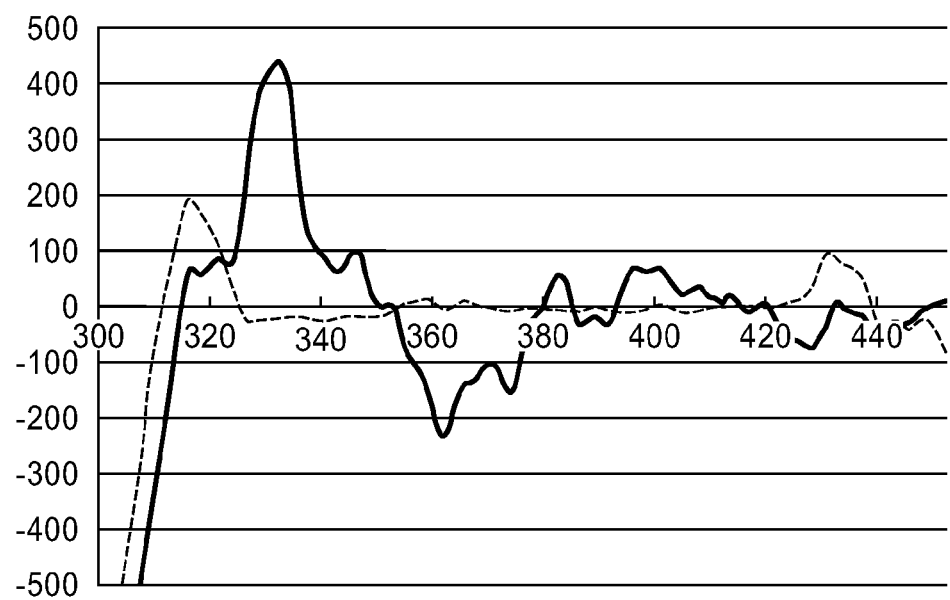

FIGS. 5A and 5B show the control errors of the substrate stage 114 when an FF manipulated variable (that is, an FF manipulated variable $g_n \Delta f(t+t_n)$ obtained by multiplying an FF manipulated variable $\Delta f(t+t_n)$ by the determined gain $g_n$) determined in accordance with the thus obtained gain is applied to the substrate stage 114. FIG. 5A is a time-series graph showing changes in the control error in the interval from time 0 to time 600 over time, and FIG. 5B is an enlarged graph showing the control error of the substrate stage 114 in the interval from time 331 to time 420 (that is, the time interval of an exposure process). FIGS. 5A and 5B show the control error of the substrate stage 114 on the ordinate, and time on the abscissa. Also, referring to FIGS. 5A and 5B, solid lines indicate the control errors of the substrate stage 114 when it is not applied with the above-mentioned FF manipulated variables, and broken lines indicate the control errors of the substrate stage 114 when it is applied with the above-mentioned FF manipulated variables.

As is obvious from FIG. 5B, the control error in the time interval of an exposure process is smaller when an FF manipulated variable is applied to the substrate stage 114, as in this embodiment, than when it is not applied to the substrate stage 114. More specifically, when no FF manipulated variable is applied to the substrate stage 114, the control error around time 331 is too large to allow an exposure process. On the other hand, as in this embodiment, when an FF manipulated variable is applied to the substrate stage 114, the control error around time 331 sufficiently settles to fall within a tolerance so as to allow an exposure process.

With this arrangement, in this embodiment, an FF manipulated variable applied to the substrate stage 114 at each time is obtained based on the result of measuring a response of the substrate stage 114 when it is applied with an FF manipulated variable (reference manipulated variable), without modeling the substrate stage 114 as a controlled object. In other words, assuming that the response of the substrate stage 114 is expressed as a linear combination of responses of the substrate stage 114 when it is applied with a reference manipulated variable having each gain as a coefficient, this gain is determined so that the difference between the response of the substrate stage 114 and the target value (target data sequence) falls within a tolerance. An FF manipulated variable (feedforward manipulated variable data sequence) is generated for the substrate stage 114 based on the determined gains. Hence, in this embodiment, the substrate stage 114 can be controlled with high accuracy without generating either a modeling load or a modeling error.

Also, in this embodiment, assuming that the response characteristic of the substrate stage 114 always remains the same, all responses (output responses) of the response $g\Delta y(t)$ to the FF manipulated variable $g\Delta f(t)$ are obtained by calculation. However, in practice, the response characteristic of the substrate stage 114 does not always remain the same. In such a case, some of the responses $g\Delta y(t)$ to the FF manipulated variable $g\Delta f(t)$ may be obtained from measurement results (actual measurement values), while the remaining responses are obtained by calculation. Alternatively, all of the responses gΔy(t) to the FF manipulated variable gΔf(t) may be obtained from measurement results (actual measurement values).

Second Embodiment

Figure 6A:
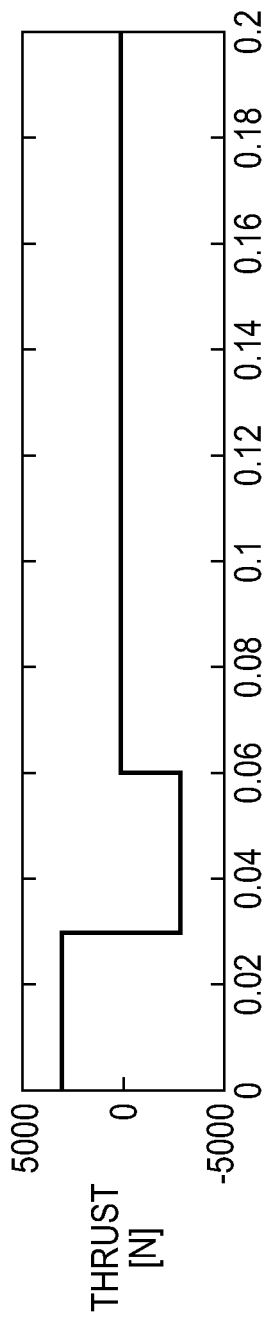
FIGS. 6A to 6C are time-series graphs showing changes in the thrust applied to the substrate stage, and the position and control error of the substrate stage, respectively, over time.
Figure 6B:
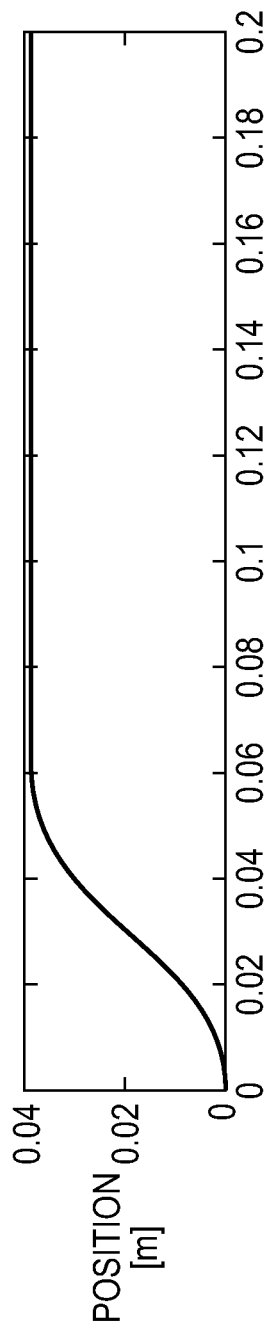
Figure 6C:
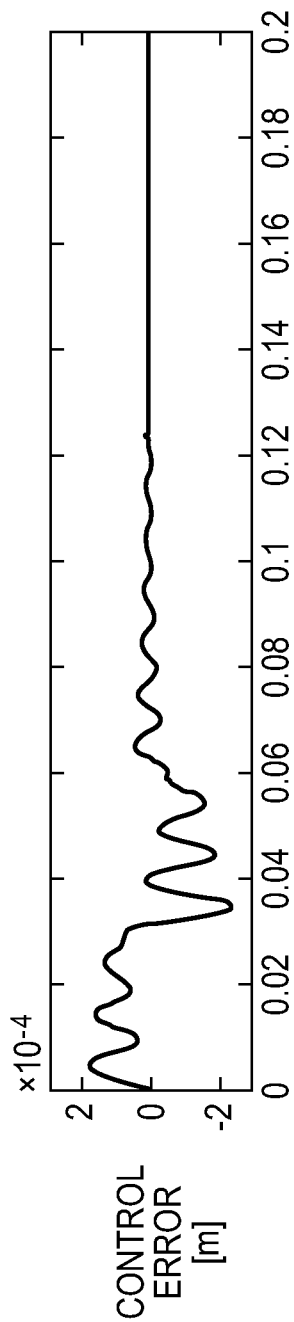

FIG. 6A is a time-series graph showing changes in the thrust, applied to a substrate stage 114 of an exposure apparatus 1, over time. FIG. 6B is a time-series graph showing changes in the position of the substrate stage 114 over time when it is applied with the thrust shown in FIG. 6A. FIG. 6C is a time-series graph showing changes in the control error of the substrate stage 114 over time when it is applied with the thrust shown in FIG. 6A. FIG. 6A shows the thrust [N] applied to the substrate stage 114 on the ordinate, and time [s] on the abscissa. FIG. 6B shows the position [m] of the substrate stage 114 on the ordinate, and time [s] on the abscissa. FIG. 6C shows the control error [m] of the substrate stage 114 on the ordinate, and time [s] on the abscissa. Respective data shown in FIGS. 6A to 6C are obtained when the substrate stage 114 is at first coordinates. Note that the coordinates of the substrate stage 114 mean coordinates (they are typically the coordinates (x, y) in the above-mentioned X-Y-Z orthogonal coordinate system, but are not limited to this example) indicating the position of the substrate stage 114 as a controlled object.

As can be seen from FIG. 6A, in the interval from time 0 to time 0.03, the substrate stage 114 is applied with a positive thrust, and therefore accelerates. As can also be seen from FIG. 6A, in the interval from time 0.03 to time 0.06, the substrate stage 114 is applied with a negative thrust, and therefore decelerates. As can be seen from FIG. 6B, the substrate stage 114 reaches a target position around time 0.06. As can be seen from FIG. 6C, a control error up to about ±200 μm has occurred during movement of the substrate stage 114, and the control error settles to the degree that it is unobservable in the scale of this graph at time 0.12 0.06 and subsequent times.

Figure 7A:
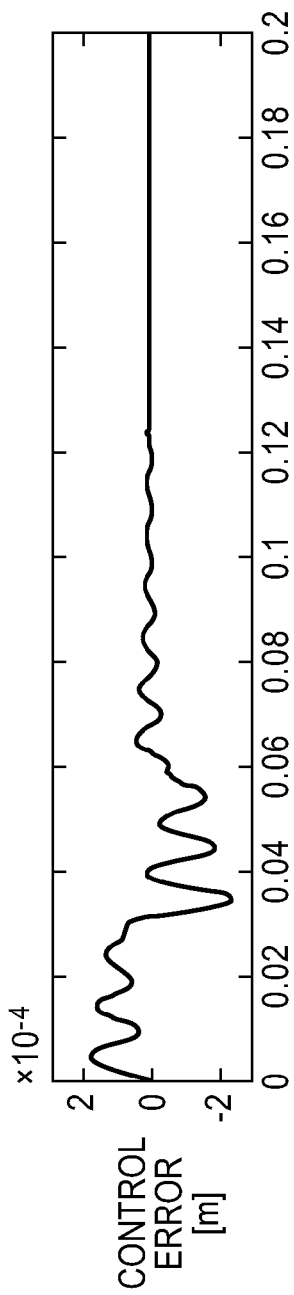
FIGS. 7A to 7C are time-series graphs showing changes in the control errors of the substrate stage for each set of coordinates of the substrate stage over time.
Figure 7B:
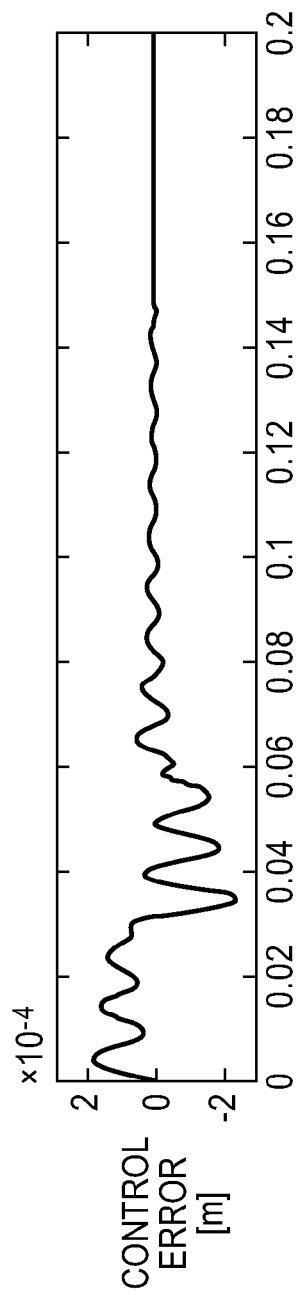
Figure 7C:
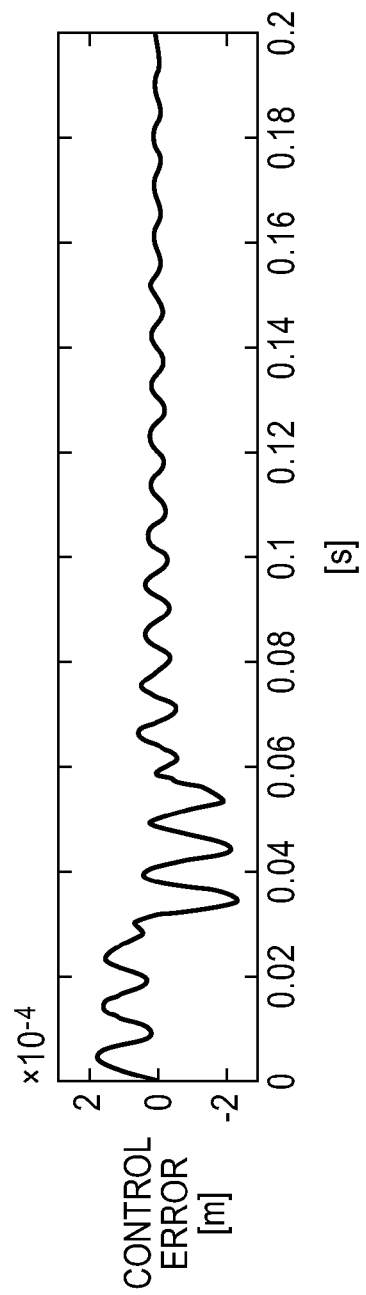
Figure 8:
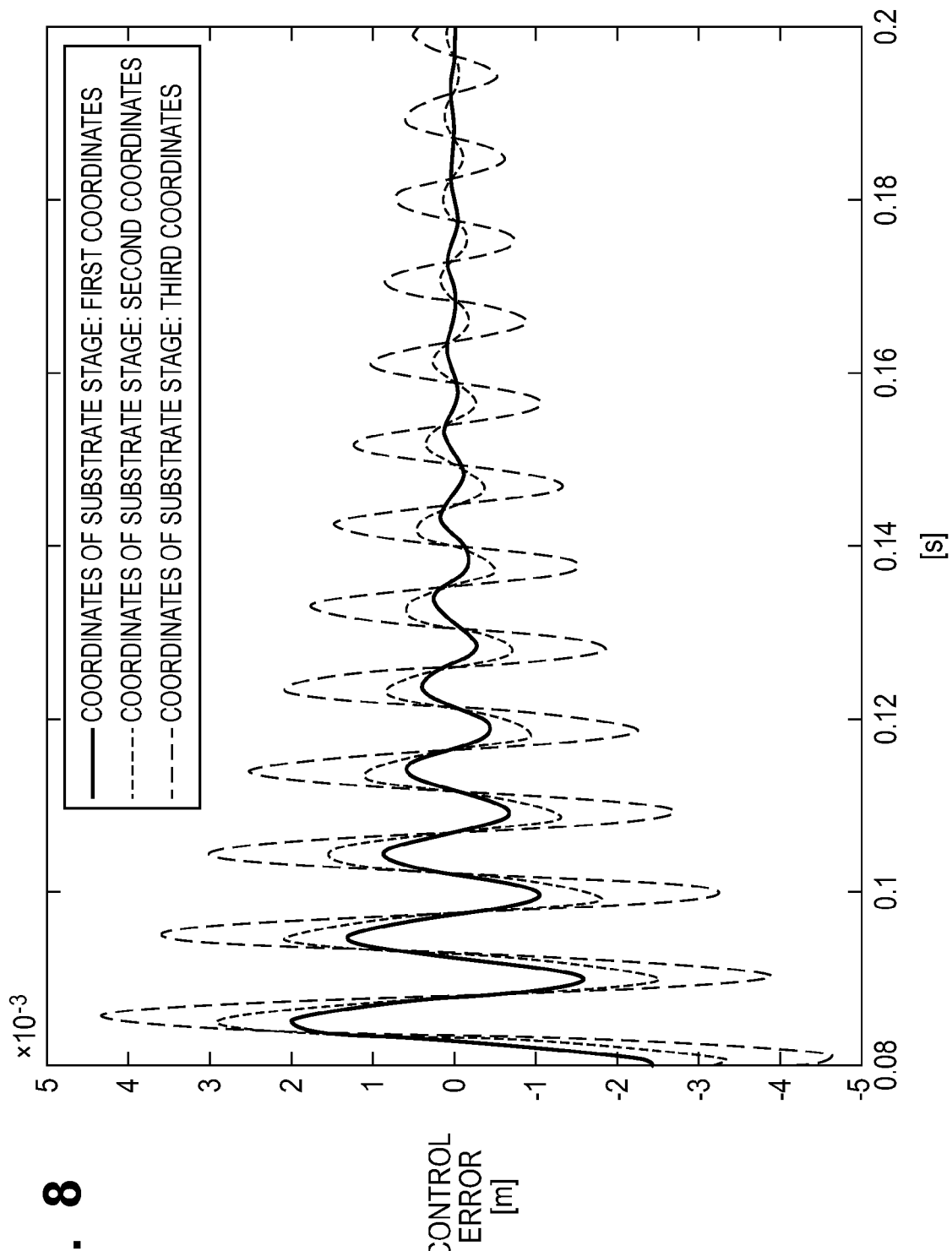
FIG. 8 is a graph showing the control errors, shown in FIGS. 7A to 7C, in superimposition.

FIGS. 7A to 7C show the control errors of the substrate stage 114 when it is applied with the thrust shown in FIG. 6A upon changing the coordinates of the substrate stage 114. FIG. 7A is a time-series graph (identical to that shown in FIG. 6C) showing changes in the control error over time when the substrate stage 114 is at the first coordinates. FIG. 7B is a time-series graph showing changes in the control error over time when the substrate stage 114 is at second coordinates. FIG. 7C is a time-series graph showing changes in the control error over time when the substrate stage 114 is at third coordinates. FIG. 8 is an enlarged graph showing the control errors, shown in FIGS. 7A to 7C, in superimposition at time 0.08 and subsequent times. FIGS. 7A to 7C and 8 show the control error [m] of the substrate stage 114 on the ordinate, and time [s] on the abscissa. As can be seen from FIGS. 7A to 7C and 8, when the coordinates of the substrate stage 114 change, the control error (its shape) of the substrate stage 114 varies even if the same thrust is applied to the substrate stage 114.

FIGS. 9A to 9C show the results of obtaining FF manipulated variables applied to the substrate stage 114 for each set of coordinates of the substrate stage 114 using the method according to the first embodiment (that is, without modeling). In this case, the time interval in which an exposure process is performed, that is, the time interval in which the control error of the substrate stage 114 is to be kept small is set from time 0.1 to time 0.2. FIG. 9A is a time-series graph showing changes in the FF manipulated variable, applied to the substrate stage 114, over time when it is at the first coordinates. FIG. 9B is a time-series graph showing changes in the FF manipulated variable, applied to the substrate stage 114, over time when it is at the second coordinates. FIG. 9C is a time-series graph showing changes in the FF manipulated variable, applied to the substrate stage 114, over time when it is at the third coordinates. FIGS. 9A to 9C show the FF manipulated variable [N] applied to the substrate stage 114 on the ordinate, and time [s] on the abscissa. As can be seen from FIGS. 9A to 9C, the optimum FF manipulated variable varies in each set of coordinates of the substrate stage 114.

Figure 11A:
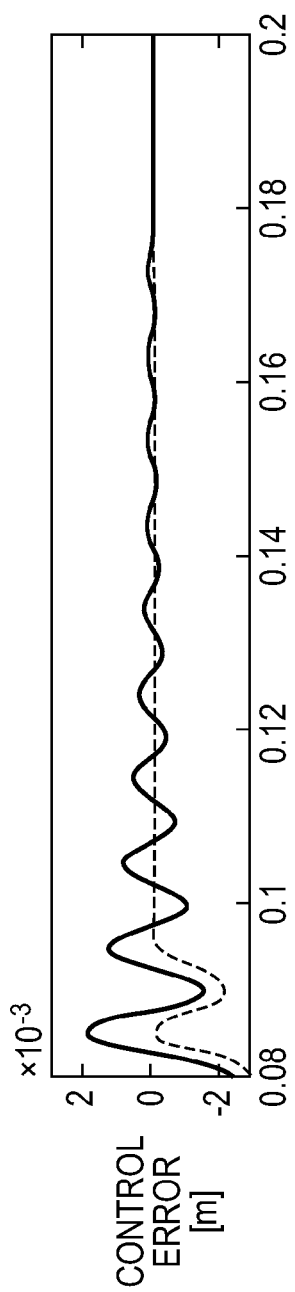
FIGS. 11A to 11C are time-series graphs showing changes in the control errors of the substrate stage over time when the feed-forward manipulated variables shown in FIGS. 9A to 9C, respectively, are applied to the substrate stage.
Figure 11B:
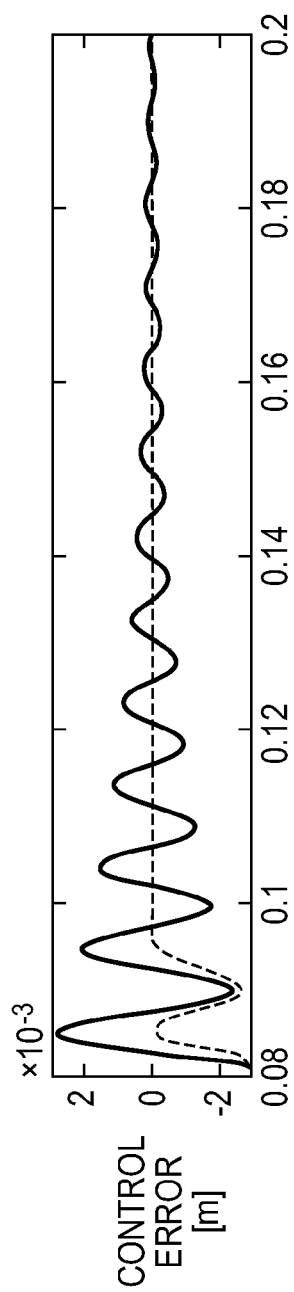
Figure 11C:
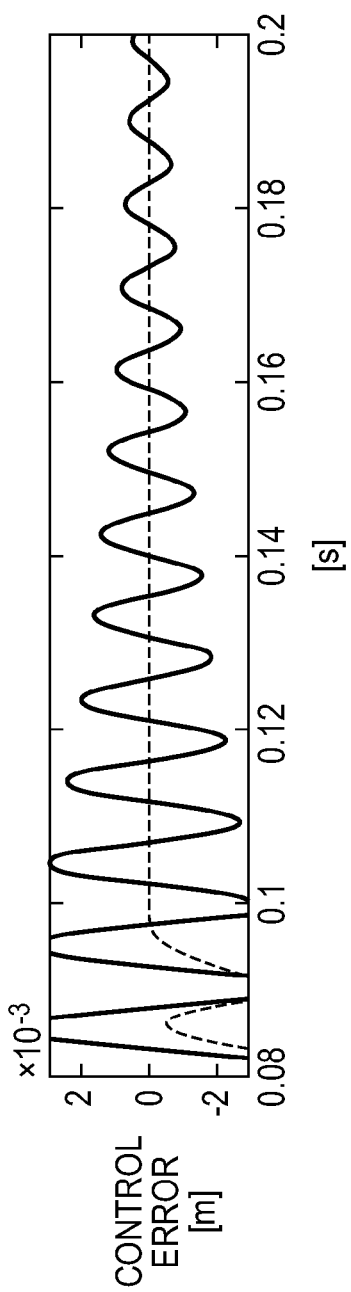
Figures 17A, 17B, 17C, 17D:
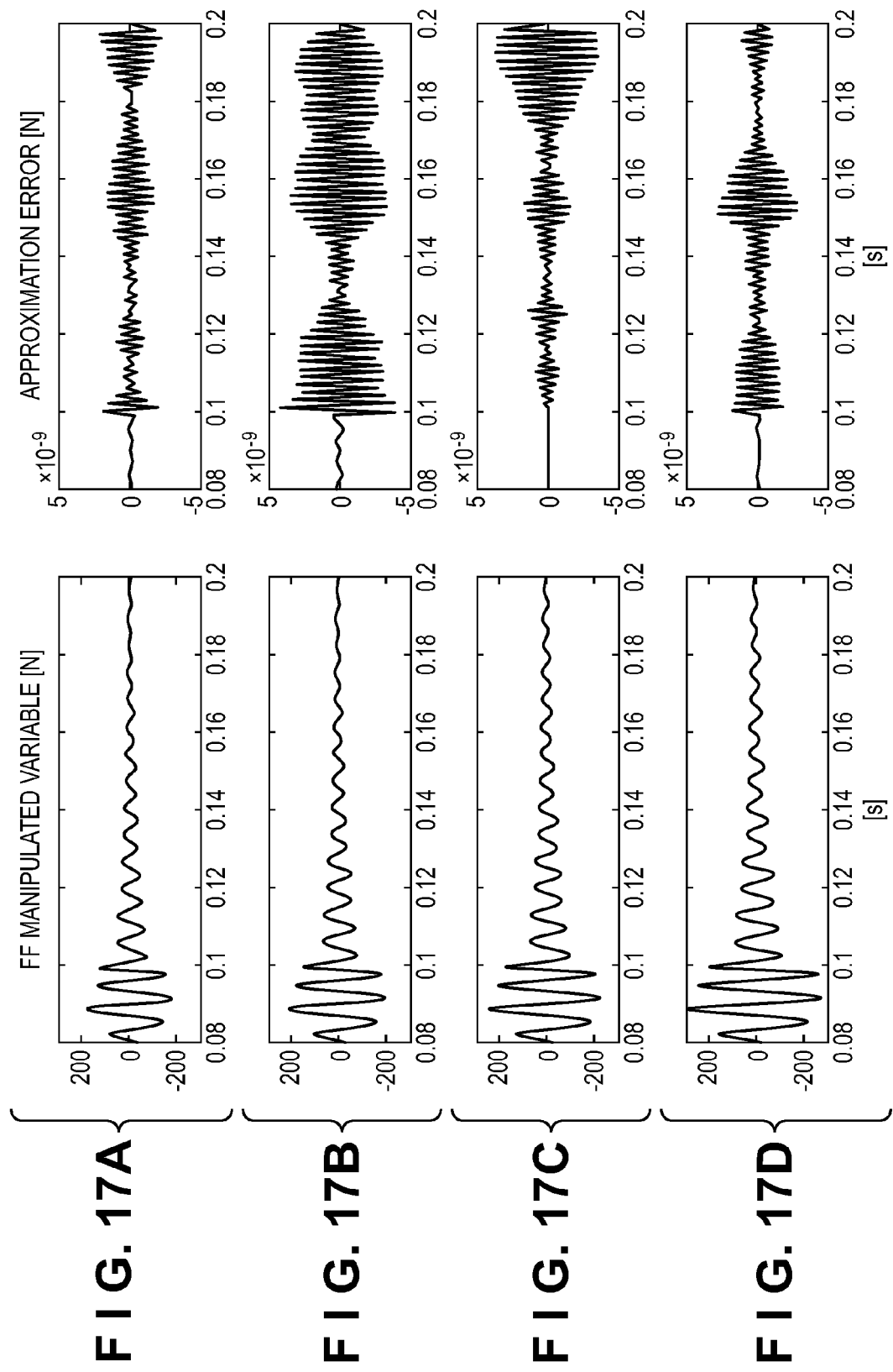
FIGS. 17A to 17D are time-series graphs showing changes in the results of approximating the feed-forward manipulated variables, and the approximation errors generated upon the approximation of the feed-forward manipulated variables, for each set of coordinates of the substrate stage, over time.

FIGS. 10A to 10C and 11A to 11C show the control errors of the substrate stage 114 when it is applied with the FF manipulated variables shown in FIGS. 9A to 9C. FIG. 10A is a time-series graph showing changes in the control error over time when the substrate stage 114 is at the first coordinates. FIG. 10B is a time-series graph showing changes in the control error over time when the substrate stage 114 is at the second coordinates. FIG. 10C is a time-series graph showing changes in the control error over time when the substrate stage 114 is at the third coordinates. FIG. 11A is an enlarged graph showing the control error shown in FIG. 10A at time 0.08 s and subsequent times. FIG. 11B is an enlarged graph showing the control error shown in FIG. 10B at time 0.08 s and subsequent times. FIG. 11C is an enlarged graph showing the control error shown in FIG. 10C at time 0.08 s and subsequent times. FIGS. 10A to 10C and 11A to 11C show the control error [m] of the substrate stage 114 on the ordinate, and time [s] on the abscissa. Also, referring to FIGS. 10A to 10C and 11A to 11C, solid lines indicate the control errors of the substrate stage 114 when it is not applied with the FF manipulated variables shown in FIGS. 9A to 9C, and broken lines indicate the control errors of the substrate stage 114 when it is applied with the FF manipulated variables shown in FIGS. 9A to 9C.

As is obvious from FIGS. 10A to 10C and 11A to 11C, the control error in the interval from time 0.1 to time 0.2 is smaller when the FF manipulated variables shown in FIGS. 9A to 9C are applied to the substrate stage 114 than when they are not applied to the substrate stage 114. More specifically, when the FF manipulated variables shown in FIGS. 9A to 9C are applied to the substrate stage 114, the control error in the interval from time 0.1 to time 0.2 sufficiently settles to fall within a tolerance.

With this operation, even if the response characteristic (output response characteristic) of the substrate stage 114 varies in each set of coordinates, the substrate stage 114 can be controlled with high accuracy. More specifically, the substrate stage 114 can be controlled with high accuracy by obtaining an FF manipulated variable (optimum FF manipulated variable) for each movement region (for example, each standard shot region) within the range in which the substrate stage 114 is movable. However, the response characteristic of the substrate stage 114 often varies depending not only on the coordinates of the substrate stage 114 but also on the movement conditions of the substrate stage 114, including the movement count and movement history of the substrate stage 114, the shot layout, and the target position profile (the mode in which the target position changes with time). In such a case, the substrate stage 114 can be controlled with high accuracy by obtaining an FF manipulated variable for each movement condition of the substrate stage 114. In other words, an FF manipulated variable (or gain) applied to the substrate stage 114 need only be obtained for each use condition under which the response characteristic of the substrate stage 114 changes.

Third Embodiment

FIGS. 12A to 12D and 13A to 13D show, for each set of coordinates of a substrate stage 114, the control errors of the substrate stage 114 when it is applied with no FF manipulated variables, the FF manipulated variables applied to the substrate stage 114, and the control errors of the substrate stage 114 when it is applied with FF manipulated variables. Note that FF manipulated variables are obtained using the method according to the first embodiment (that is, without modeling). In this case, the time interval in which an exposure process is performed, that is, the time interval in which the control error of the substrate stage 114 is to be kept small is set from time 0.1 to time 0.2. FIGS. 12A to 12D are time-series graphs showing changes in the control errors (without FF manipulated variables), FF manipulated variables, and control errors (with FF manipulated variables) over time when the substrate stage 114 is at first, second, third, and fourth coordinates, respectively. FIGS. 13A to 13D are time-series graphs showing changes in the control errors (without FF manipulated variables), FF manipulated variables, and control errors (with FF manipulated variables) over time when the substrate stage 114 is at fifth, sixth, seventh, and eighth coordinates, respectively. FIGS. 12A to 12D and 13A to 13D show the control error (without an FF manipulated variable) [m] of the substrate stage 114, the FF manipulated variable [N] applied to the substrate stage 114, and the control error (with an FF manipulated variable) [m] of the substrate stage 114 on the ordinate in the order named from the left graph. Also, FIGS. 12A to 12D and 13A to 13D show time [s] on the abscissa in all the graphs.

As can be seen from FIGS. 12A to 12D and 13A to 13D, as the coordinates of the substrate stage 114 vary, the control error (its shape) of the substrate stage 114 also varies, so the FF manipulated variable applied to the substrate stage 114 varies, as described above. As can also be seen from FIGS. 12A to 12D and 13A to 13D, when FF manipulated variables are applied to the substrate stage 114, the control error in the interval from time 0.1 to time 0.2 sufficiently settles to fall within a tolerance.

In an exposure apparatus, one substrate includes 100 or more shot regions, so it is necessary to transfer the pattern of a mask at 100 or more different coordinates of a substrate stage while moving (scanning) the substrate stage. Therefore, when the FF manipulated variable applied to the substrate stage varies in each set of coordinates of the substrate stage, the exposure apparatus must have a memory which stores 100 or more FF manipulated variables.

Since an exposure apparatus has a multilevel hierarchical computer structure, it is relatively easy to store 100 or more FF manipulated variables in a memory as long as the hierarchical levels need not be taken into consideration. However, it takes a very short time (about 0.1 [s]) to move a substrate stage from given coordinates to the next coordinates, so it is difficult to transfer the FF manipulated variable at the next coordinates from a higher hierarchical level during this time. Hence, data required to control the substrate stage is stored in a lower-level computer (memory), which has a limited memory capacity, so it is very difficult to store 100 or more FF manipulated variables at present.

Hence, how to reduce the amount of data of the FF manipulated variable will be described in this embodiment. In this case, eight FF manipulated variables corresponding to eight sets of coordinates (first to eight coordinates) of the substrate stage 114 will be described as an example herein (see FIGS. 12A to 12D and 13A to 13D). FIGS. 14A to 14D show the results of component decomposition of the FF manipulated variables shown in FIGS. 12A to 12D, respectively, and FIGS. 15A to 15D show the results of component decomposition of the FF manipulated variables shown in FIGS. 13A to 13D, respectively. In this embodiment, the FF manipulated variable is decomposed into respective components using eigenvalue decomposition. FIGS. 14A to 14D and 15A to 15D show time series of a plurality of components (component data sequences) A, B, C, D, E, F, G, and H included in the FF manipulated variables on the left sides, and the intensities of the plurality of components A to H on the right sides. Referring to the right sides of FIGS. 14A to 14D and 15A to 15D, the intensities corresponding to the eight FF manipulated variables are plotted (that is, eight plots are present). Therefore, the eight FF manipulated variables are equal to the linear sums of the products of the plurality of components A to H and the intensities of the plurality of components A to H.

Eigenvalue decomposition that provides an example of component decomposition of the FF manipulated variable will be described in detail. First, letting $f_1(t)$ to $f_8(t)$ be data (time-series data) of the eight FF manipulated variables, a matrix F obtained by concatenating these data is given by:

$$F = [f_1(t) \ f_2(t) \ f_3(t) \ f_4(t) \ f_5(t) \ f_6(t) \ f_7(t) \ f_8(t)] \quad (8)$$

$$= \begin{bmatrix} f_{11} & f_{12} & f_{13} & f_{14} & f_{15} & f_{16} & f_{17} & f_{18} \\ f_{21} & f_{22} & f_{23} & f_{24} & f_{25} & f_{26} & f_{27} & f_{28} \\ \vdots & \vdots & \vdots & \vdots & \vdots & \vdots & \vdots & \vdots \\ f_{n1} & f_{n2} & f_{n3} & f_{n4} & f_{n5} & f_{n6} & f_{n7} & f_{n8} \end{bmatrix}$$

Also, a covariance matrix C of the matrix F is given by:

$$C = F^T * F \quad (9)$$

By eigenvalue analysis, matrices V and D that satisfy:

$$CV = VD \quad (10)$$

are obtained.

Then, a matrix Z representing eight orthogonal vectors is given by:

$$Z = FV \quad (11)$$

$$= \begin{bmatrix} z_{11} & z_{12} & z_{13} & z_{14} & z_{15} & z_{16} & z_{17} & z_{18} \\ z_{21} & z_{22} & z_{23} & z_{24} & z_{25} & z_{26} & z_{27} & z_{28} \\ \vdots & \vdots & \vdots & \vdots & \vdots & \vdots & \vdots & \vdots \\ z_{n1} & z_{n2} & z_{n3} & z_{n4} & z_{n5} & z_{n6} & z_{n7} & z_{n8} \end{bmatrix}$$

Note that when vectors are orthogonal to each other, one vector cannot be expressed by addition of other vectors.

With this operation, eight orthogonal vectors can be derived from the eight FF manipulated variables.

The eight FF manipulated variables are decomposed into orthogonal vectors. In other words, the eight FF manipulated variables $f_1(t)$ to $f_8(t)$ are expressed as the linear sums of orthogonal vectors $z_1(t)$ to $z_8(t)$ (the sums of the results of multiplying the orthogonal vectors $z_1(t)$ to $z_8(t)$ by given constants of proportionality). Letting G be a coefficient matrix, we have:

$$\begin{bmatrix} f_{11} & f_{12} & f_{13} & f_{14} & f_{15} & f_{16} & f_{17} & f_{18} \\ f_{21} & f_{22} & f_{23} & f_{24} & f_{25} & f_{26} & f_{27} & f_{28} \\ \vdots & \vdots & \vdots & \vdots & \vdots & \vdots & \vdots & \vdots \\ f_{n1} & f_{n2} & f_{n3} & f_{n4} & f_{n5} & f_{n6} & f_{n7} & f_{n8} \end{bmatrix} = \quad (12)$$

$$\begin{bmatrix} z_{11} & z_{12} & z_{13} & z_{14} & z_{15} & z_{16} & z_{17} & z_{18} \\ z_{21} & z_{22} & z_{23} & z_{24} & z_{25} & z_{26} & z_{27} & z_{28} \\ \vdots & \vdots & \vdots & \vdots & \vdots & \vdots & \vdots & \vdots \\ z_{n1} & z_{n2} & z_{n3} & z_{n4} & z_{n5} & z_{n6} & z_{n7} & z_{n8} \end{bmatrix}$$

$$\begin{bmatrix} g_{11} & g_{12} & g_{13} & g_{14} & g_{15} & g_{16} & g_{17} & g_{18} \\ g_{21} & g_{22} & g_{23} & g_{24} & g_{25} & g_{26} & g_{27} & g_{28} \\ g_{31} & g_{32} & g_{33} & g_{34} & g_{35} & g_{36} & g_{37} & g_{38} \\ g_{41} & g_{42} & g_{43} & g_{44} & g_{45} & g_{46} & g_{47} & g_{48} \\ g_{51} & g_{52} & g_{53} & g_{54} & g_{55} & g_{56} & g_{57} & g_{58} \\ g_{61} & g_{62} & g_{63} & g_{64} & g_{65} & g_{66} & g_{67} & g_{68} \\ g_{71} & g_{72} & g_{73} & g_{74} & g_{75} & g_{76} & g_{77} & g_{78} \\ g_{81} & g_{82} & g_{83} & g_{84} & g_{85} & g_{86} & g_{87} & g_{88} \end{bmatrix}$$

$$F = ZG$$

Therefore, when both sides of equation (12) are multiplied by an inverse matrix of Z, the coefficient matrix G is obtained as:

$$G = Z^{-1}F \quad (13)$$

With this operation, the eight FF manipulated variables can be decomposed into orthogonal components A to H.

Note that as can be seen from the components A to H on the left sides of FIGS. 14A to 14D and 15A to 15D, the components A to F other than the components G and H are considerably small. This means that the eight FF manipulated variables can be represented (approximated) by only the components G and H.

FIGS. 16A to 16D and 17A to 17D show, for each set of coordinates of the substrate stage 114, the results (approximate FF manipulated variables) of approximating, by the components G and H, the FF manipulated variables applied to the substrate stage 114, and the approximation errors (the differences between the FF manipulated variables and the approximate FF manipulated variables) generated upon the approximation of the FF manipulated variables. FIGS. 16A to 16D are time-series graphs showing changes in the approximate FF manipulated variables and approximation errors over time when the substrate stage 114 is at first, second, third, and fourth coordinates, respectively. FIGS. 17A to 17D are time-series graphs showing changes in the approximate FF manipulated variables and approximation errors over time when the substrate stage 114 is at fifth, sixth, seventh, and eighth coordinates, respectively. FIGS. 16A to 16D and 17A to 17D show the FF manipulated variable [N] applied to the substrate stage 114 and the approximation error [N] on the ordinate in the order named from the left graph, and time [s] on the abscissa. Also, referring to the left graphs shown in FIGS. 16A to 16D and 17A to 17D, solid lines indicate FF manipulated variables which are not approximated by the components G and H, and broken lines indicate approximate FF manipulated variables approximated by the components G and H. As can be seen from the left graphs shown in FIGS. 16A to 16D and 17A to 17D, the FF manipulated variables (solid lines) and the approximate FF manipulated variables (broken lines) are nearly equal to each other, so their difference (approximation error) is unobservable. As can also be seen from the left graphs shown in FIGS. 16A to 16D and 17A to 17D, the approximation errors are very small.

FIGS. 18A to 18D and 19A to 19D show, for each set of coordinates of the substrate stage 114, the control errors of the substrate stage 114 when it is applied with no FF manipulated variables, the approximate FF manipulated variables applied to the substrate stage 114, and the control errors of the substrate stage 114 when it is applied with approximate FF manipulated variables. In this case, the approximate FF manipulated variables are the results of approximating the FF manipulated variables shown in FIGS. 12A to 12D and 13A to 13D by the components G and H. FIGS. 18A to 18D are time-series graphs showing changes in the control errors (without FF manipulated variables), the approximate FF manipulated variables, and the control errors (with approximate FF manipulated variables) over time when the substrate stage 114 is at the first, second, third, and fourth coordinates, respectively. FIGS. 19A to 19D are time-series graphs showing changes in the control errors (without FF manipulated variables), the approximate FF manipulated variables, and the control errors (with approximate FF manipulated variables) over time when the substrate stage 114 is at the fifth, sixth, seventh, and eighth coordinates, respectively. FIGS. 18A to 18D and 19A to 19D show the control error (without an FF manipulated variable) [m] of the substrate stage 114, the approximate FF manipulated variable [N], and the control error (with an approximate FF manipulated variable) [m] of the substrate stage 114 on the ordinate in the order named from the left graphs, and time [s] on the abscissa.

As can be seen from FIGS. 18A to 18D and 19A to 19D, even when an approximate FF manipulated variable is applied to the substrate stage 114, the control error in the interval from time 0.1 to time 0.2 sufficiently settles to fall within a tolerance. This is because the approximation errors generated as the FF manipulated variables applied to the substrate stage 114 are approximated by the components H and G are very small, as described above.

Hence, in an exposure apparatus 1 (control device 120), a memory 126 stores, for each set of coordinates of the substrate stage 114, principal components used to approximate the FF manipulated variable, and their intensities, in place of the FF manipulated variable itself. In other words, upon approximating the FF manipulated variable by the linear sum of the products of a plurality of different components and their intensities, the memory 126 need only store the plurality of components and their intensities. In this embodiment, the memory load can be reduced because the memory 126 need only store the two components G and H of the FF manipulated variable, and their intensities for each set of coordinates of the substrate stage 114, instead of storing eight FF manipulated variables.

Also, the case wherein the memory 126 stores, for each set of coordinates of the substrate stage 114, components (principal components) included in the FF manipulated variable, and their intensities has been taken as an example in this embodiment. However, the memory 126 may store components (principal components) included in the FF manipulated variable, and their intensities for each operation of moving the substrate stage 114.

The present invention has been described above by taking a substrate stage of an exposure apparatus as an example of the controlled object (that is, assuming that the controlled variable is the position of the substrate stage). However, the controlled object is not limited to a substrate stage, and the present invention is applicable to various controlled objects which require feed-forward control. The case wherein the present invention is applied to a temperature control system (that is, the case wherein the controlled variable is the temperature of a controlled object) will be taken as an example hereinafter.

Fourth Embodiment

Figure 20:
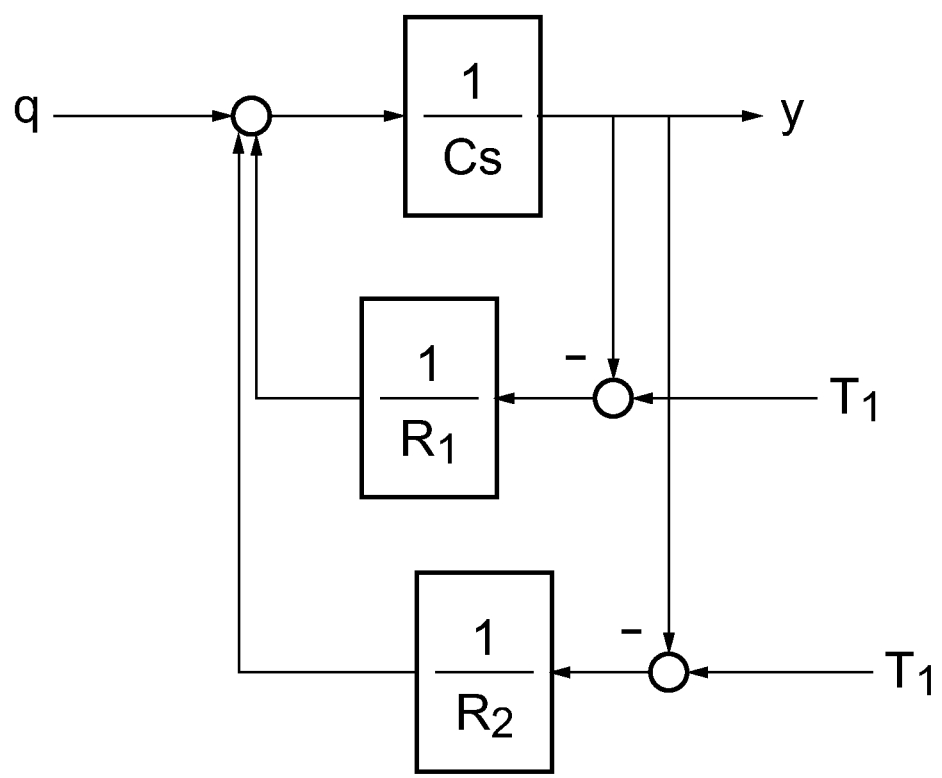
FIG. 20 is a block diagram of a temperature control system.

FIG. 20 is a block diagram of a temperature control system. The temperature control system shown in FIG. 20 serves as a control system which has a heat flow rate q [J/s] as its input, and a temperature y [K] as its output, and controls the temperature of a controlled object in accordance with the heat flow rate from a temperature controller. The controlled object is in contact with an object $OB_1$ having a temperature $T_1$ [K] through a thermal resistance $R_1$ [K/W], and is in contact with an object $OB_2$ having a temperature $T_2$ [K] through a thermal resistance $R_2$ [K/W]. Therefore, heat flows from the objects $OB_1$ and $OB_2$ into the controlled object at flow rates obtained by dividing the differences in temperature between the controlled object and the objects $OB_1$ and $OB_2$ by the thermal resistances $R_1$ and $R_2$, respectively. In other words, the controlled object receives the heat flow rate q from the temperature controller, a heat flow rate $(T_1-y)/R_1$ from the object $OB_1$, and a heat flow rate $(T_2-y)/R_2$ from the object $OB_2$. When the flow rate of heat that flows into the controlled object is integrated with respect to time, the amount of heat that flows into the controlled object is obtained. When the amount of heat that flows into the controlled object is divided by a heat capacity C [J/K] of the controlled object, the temperature of the controlled object is obtained.

FIGS. 21A to 21C show changes in temperature of the objects $OB_1$ and $OB_2$ and controlled object upon a given operation of the temperature control system. FIG. 21A is a time-series graph showing changes in the temperature $T_1$ of the object $OB_1$ over time. FIG. 21B is a time-series graph showing changes in the temperature $T_2$ of the object $OB_2$ over time. FIG. 21C is a time-series graph showing changes in the temperature y of the controlled object over time. FIG. 21A shows the temperature $T_1$ [K] of the object $OB_1$ on the ordinate, and time [s] on the abscissa. FIG. 21B shows the temperature $T_2$ [K] of the object $OB_2$ on the ordinate, and time [s] on the abscissa. FIG. 21C shows the temperature y [K] of the controlled object on the ordinate, and time [s] on the abscissa. Also, in this case, $R_1=R_2=10$ [K/W], and C=10 [J/K].

In this embodiment, assuming that the temperatures of the objects $OB_1$ and $OB_2$ always change at the same rate (FIGS. 21A and 21B) when the temperature control system performs the same operation, the change in temperature of the controlled object is reduced by applying an FF manipulated variable to the controlled object.

First, when the temperature control system is operated without applying an FF manipulated variable to the controlled object, the temperature of the controlled object changes, as shown in FIG. 21C. Letting e(t) be the change in temperature of the controlled object, we have:

$$e(t)=[e_0\, e_1 \ldots e_{100}]^T \qquad (14)$$

To obtain the temperature characteristic of the controlled object from an actual measurement value, the temperature control system is operated upon applying a reference heat flow rate $q_0(t)$, as shown in FIG. 22A. Letting $y_0(t)$ be the change in temperature of the controlled object at this time, the change in temperature of the controlled object for the reference heat flow rate $q_0(t)$ is given by $\Delta y_0(t)=y_0(t)-e(t)$ (see FIGS. 22B and 22C). Therefore, a response $g_0\Delta y_0(t)$ to a heat flow rate $g_0q_0(t)$ of a gain $g_0$ is obtained as:

$$\Delta y_0(t)=[y_0\, y_1 \ldots y_{100}]^T$$

$$g_0\Delta y_0(t)=g_0[y_0\, y_1 \ldots y_{100}]^T \qquad (15)$$

In this embodiment, data (actual measurement values) are obtained by only these two operations. Also, in this embodiment, 2 [J/s] is applied to the controlled object as a reference heat flow rate in the interval from time 0 [s] to time 5 [s]. Note that FIG. 22A is a time-series graph showing changes in the reference heat flow rate, applied to the controlled object, over time. FIG. 22B is a time-series graph showing the temperature of the controlled object over time when it is applied with the reference heat flow rate shown in FIG. 22A. FIG. 22C is a time-series graph showing changes in temperature of the controlled object over time when it is applied with the reference heat flow rate shown in FIG. 22A. FIG. 22A shows the heat flow rate q [J/s] on the ordinate, and time [s] on the abscissa. FIG. 22B shows the temperature [K] of the controlled object on the ordinate, and time [s] on the abscissa. FIG. 22C shows the change in temperature $\Delta y$ [K] of the controlled object on the ordinate, and time [s] on the abscissa.

An FF manipulated variable $q_1(t)$ when the reference heat flow rate $q_0(t)$ is applied to the controlled object with a gain $g_1$ at time 1 is given by:

$$q_1(t)=g_1q_0(t-1) \qquad (16)$$

Therefore, a response $\Delta y_1(t)$ to the FF manipulated variable $q_1(t)$ is given by:

$$\Delta y_1(t)=g_1\Delta y_0(t-1)=g_1[0\, y_0 \ldots y_{99}]^T \qquad (17)$$

Similarly, letting $q_2(t)$ to $q_{100}(t)$ be the FF manipulated variables when the reference heat flow rate $q_0(t)$ is applied with gains $g_2$ to $g_{100}$ at times 2 to 100, respectively, we have:

$$[g_0q_0(t) \quad q_1(t) \quad q_2(t) \quad \ldots \quad q_{100}(t)] = \qquad (18)$$

$$[g_0q_0(t) \quad g_1q_0(t-1) \quad g_2q_0(t-1) \quad \ldots \quad g_{100}q_0(t-100)] =$$

$$\begin{bmatrix} g_0q_0 & 0 & 0 & \ldots & 0 \\ g_0q_1 & g_1q_0 & 0 & \ldots & 0 \\ g_0q_2 & g_1q_1 & g_2q_0 & \ldots & 0 \\ \vdots & \vdots & \vdots & \ddots & \vdots \\ g_0q_{100} & g_1q_{99} & g_2q_{98} & \ldots & g_{100}q_0 \end{bmatrix}$$

Also, letting $\Delta y_2(t)$ to $\Delta y_{100}(t)$ be the responses to the FF manipulated variables $q_2(t)$ to $q_{100}(t)$, respectively, we have:

$$[\Delta g_0\Delta y_0(t) \quad \Delta y_1(t) \quad \Delta y_2(t) \quad \ldots \quad \Delta y_{100}(t)] = \qquad (19)$$

$$[g_0\Delta y_0(t) \quad g_1\Delta y_0(t-1) \quad g_2\Delta y_0(t-2) \quad \ldots \quad g_{100}\Delta y_0(t-100)] =$$

$$\begin{bmatrix} g_0y_0 & 0 & 0 & \ldots & 0 \\ g_0y_1 & g_1y_0 & 0 & \ldots & 0 \\ g_0y_2 & g_1y_1 & g_2y_0 & \ldots & 0 \\ \vdots & \vdots & \vdots & \ddots & \vdots \\ g_0y_{100} & g_1y_{99} & g_2y_{98} & \ldots & g_{100}y_0 \end{bmatrix}$$

Referring to equations (18) and (19), when all the FF manipulated variables $g_0q_0$ to $g_{100}q_0$ are applied to the controlled object, a response Y(t) of the controlled object is the sum of all responses $g_0y_0$ to $g_{100}y_0$ as given by:

$$Y(t) = \begin{bmatrix} g_0 y_0 + 0 + 0 + \ldots + 0 \\ g_0 y_1 + g_1 y_0 + 0 + \ldots + 0 \\ g_0 y_2 + g_1 y_1 + g_2 y_0 + \ldots + 0 \\ \vdots \\ g_0 y_{100} + g_1 y_{99} + g_2 y_{98} + \ldots + g_{100} y_0 \end{bmatrix} \quad (20)$$

$$= \begin{bmatrix} y_0 & 0 & 0 & \ldots & 0 \\ y_1 & y_0 & 0 & \ldots & 0 \\ y_2 & y_1 & y_0 & \ldots & 0 \\ \vdots & \vdots & \vdots & \ddots & \vdots \\ y_{100} & y_{99} & y_{98} & \ldots & y_0 \end{bmatrix} \begin{bmatrix} g_0 \\ g_1 \\ g_2 \\ \vdots \\ g_{100} \end{bmatrix}$$

$$= Y_0 G$$

Referring to equation (20), the response Y(t) of the controlled object is the product of a gain matrix G and a response matrix $Y_0$ obtained based on the response to the reference heat flow rate. Note that a gain (gain matrix G) for reducing the change in temperature of the controlled object is obtained in the same way as in the first embodiment. More specifically, the gain need only be obtained so that the sign of the response Y(t) of the controlled object to the FF manipulated variable becomes opposite to that of the change in temperature e(t) of the controlled object when it is applied with no FF manipulated variable, as per:

$$Y(t) = Y_0 G = -e(t) \quad (21)$$

Therefore, when both sides of equation (21) are multiplied by the pseudo-inverse matrix of the response matrix $Y_0$, a gain (gain matrix G) for reducing the change in temperature of the controlled object can be obtained (determined) as:

$$G = -Y_0^{-1} e(t) \quad (22)$$

When a gain is obtained in this way, a sum Q(t) of FF manipulated variables $g_0 q_0(t), q_1(t), \ldots, q_{100}(t)$ is given by:

$$Q(t) = \begin{bmatrix} g_0 q_0 + 0 + 0 + \ldots + 0 \\ g_0 q_1 + g_1 q_0 + 0 + \ldots + 0 \\ g_0 q_2 + g_1 q_1 + g_2 q_0 + \ldots + 0 \\ \vdots \\ g_0 q_{100} + g_1 q_{99} + g_2 q_{98} + \ldots + g_{100} q_0 \end{bmatrix} \quad (23)$$

$$= \begin{bmatrix} q_0 & 0 & 0 & \ldots & 0 \\ q_1 & q_0 & 0 & \ldots & 0 \\ q_2 & q_1 & q_0 & \ldots & 0 \\ \vdots & \vdots & \vdots & \ddots & \vdots \\ q_{100} & q_{99} & q_{98} & \ldots & q_0 \end{bmatrix} \begin{bmatrix} g_0 \\ g_1 \\ g_2 \\ \vdots \\ g_{100} \end{bmatrix}$$

$$= Q_0 G$$

Therefore, an FF manipulated variable $g_n q_n$ (that is, Q(t)) can be obtained as an optimum FF manipulated variable, applied to the controlled object, by multiplying an FF manipulated variable $q_n$ by a gain $g_n$.

Figure 23A:
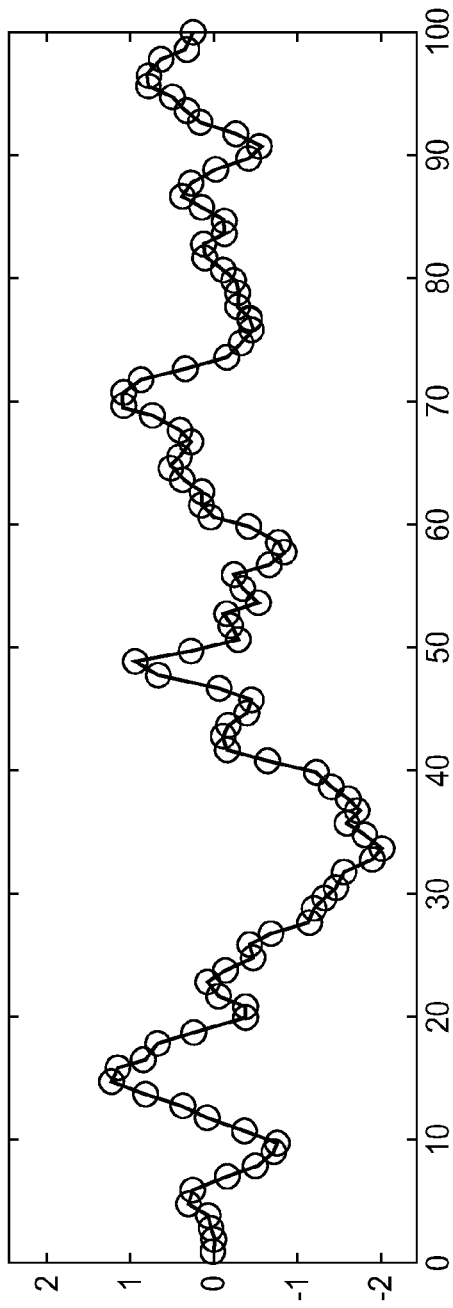
FIGS. 23A and 23B are time-series graphs showing changes in the feed-forward manipulated variable applied to the controlled object, and the temperature of the controlled object, respectively, over time.
Figure 23B:
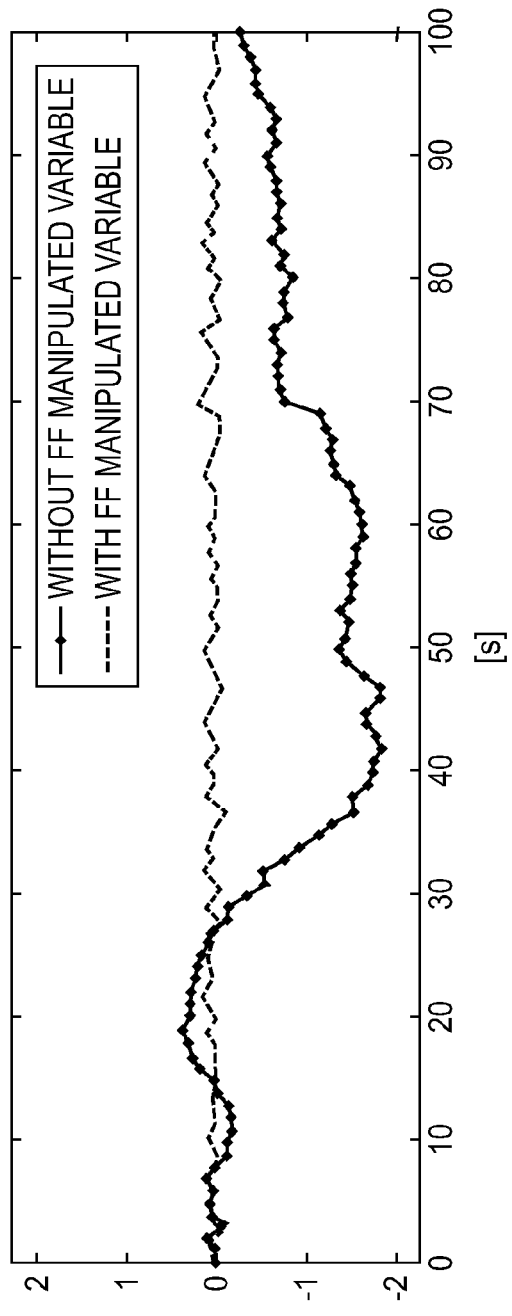

FIG. 23A shows the FF manipulated variable determined in accordance with the thus obtained gain. Also, FIG. 23B shows the temperature of the controlled object when it is applied with the FF manipulated variable shown in FIG. 23A. FIG. 23A is a time-series graph showing changes in the FF manipulated variable, applied to the controlled object, over time. FIG. 23B is a time-series graph showing changes in the temperature y of the controlled object over time. FIG. 23A shows the FF manipulated variable [J/s] on the ordinate, and time [s] on the abscissa. FIG. 23B shows the temperature y [K] of the controlled object on the ordinate, and time [s] on the abscissa. Also, referring to FIG. 23B, a solid line indicates the temperature (change in temperature) of the controlled object when it is not applied with the FF manipulated variable shown in FIG. 23A, and a broken line indicates the temperature (change in temperature) of the controlled object when it is applied with the FF manipulated variable shown in FIG. 23A.

As is obvious from FIG. 23B, the change in temperature of the controlled object is smaller when an FF manipulated variable is applied to the controlled object, as in this embodiment, than when it is not applied to the controlled object. More specifically, the change in temperature of the controlled object is about 2 [K] when it is applied with no FF manipulated variable, while the change in temperature of the controlled object is reduced to the noise level when it is applied with an FF manipulated variable.

With this operation, in this embodiment, an FF manipulated variable applied to the controlled object at each time is obtained based on the result of measuring the response (temperature) of the controlled object when it is applied with an FF manipulated variable (reference manipulated variable), without modeling the controlled object (its temperature characteristic). Hence, in this embodiment, the temperature of the controlled object can be controlled with high accuracy without generating either a modeling load or a modeling error.

<Embodiment of Method of Manufacturing Article>

A method of manufacturing an article according to this embodiment is suitable for manufacturing various articles including a microdevice such as a semiconductor device and an element having a microstructure. This method can include a step of forming a pattern on an object (for example, a substrate having a resist material such as a photosensitive agent or a resin on its surface) using a lithography apparatus such as the above-mentioned exposure apparatus (a step of performing exposure, imprinting, or drawing on an object). This method can also include a step of processing (for example, developing or etching) the object having the pattern formed on it in the forming step. This method can moreover include subsequent known steps (for example, oxidation, film formation, vapor deposition, doping, planarization, etching, resist removal, dicing, bonding, and packaging). The method of manufacturing an article according to this embodiment is more advantageous in terms of at least one of the performance, quality, productivity, and manufacturing cost of an article than the conventional method.

Note that the above-mentioned lithography apparatus is not limited to the above-mentioned exposure apparatus, and may be an imprint apparatus or a charged particle drawing apparatus.

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (for example, computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-087935 filed on Apr. 6, 2012, which is hereby incorporated by reference herein in its entirety.

What is claimed is:

1. A control apparatus including a feed-forward controller configured to perform feed-forward control of a controlled object, the apparatus being configured to
obtain a first response data sequence of the controlled object measured by applying a first manipulated variable to the controlled object, and
determine, under a condition that a second response data sequence of the controlled object to be obtained in a case where a second manipulated variable data sequence, obtained by respectively multiplying the first manipulated variable by gains as variables which can vary with time, is applied to the controlled object, is expressed as a linear combination of the first response data sequence with the gains as coefficients of the linear combination, the gains so that a discrepancy between the expressed second response data sequence and a target data sequence falls within a tolerance,
wherein the feed-forward controller is configured to generate a feed-forward manipulated variable data sequence for the controlled object based on the determined gains and the first manipulated variable.

2. The apparatus according to claim 1, wherein the apparatus is configured to obtain the first response data sequence with respect to a plurality of the first response data sequence respectively obtained by applying the first manipulated variable to the controlled object at different times.

3. The apparatus according to claim 1, wherein a controlled variable of the apparatus includes a position of the controlled object.

4. The apparatus according to claim 3, wherein the apparatus is configured to determine the gains with respect to each of a plurality of regions in which the controlled object moves.

5. The apparatus according to claim 1, wherein a controlled variable of the apparatus includes a temperature of the controlled object.

6. The apparatus according to claim 1, wherein the apparatus is configured to determine the gains with respect to each of a plurality of use conditions of the controlled object under which response characteristics of the controlled object are different mutually.

7. The apparatus according to claim 1, wherein the apparatus comprises a storage configured to store a plurality of component data sequence used to obtain the feed-forward manipulated variable data sequence by a linear combination of the plurality of component data sequence, and coefficients for the linear combination of the plurality of component data sequence.

8. The apparatus according to claim 1, wherein the apparatus comprises a feedback controller configured to perform feedback control of the controlled object so as to reduce an error between target data and a response of the controlled object.

9. A lithography apparatus which forms a pattern on an object, the apparatus comprising:
an adjusting device configured to adjust a state of the object; and
a control apparatus defined in claim 1 and configured to control the adjusting device as a controlled object.

10. A method of manufacturing an article, the method comprising steps of:
forming a pattern on an object using a lithography apparatus; and
processing the object, on which the pattern has been formed, to manufacture the article, wherein the lithography apparatus includes:
an adjusting device configured to adjust a state of the object; and
a control apparatus configured to control the adjusting device as a controlled object,
wherein the control apparatus includes a feed-forward controller configured to perform feed-forward control of the controlled object, the control apparatus being configured to
obtain a first response data sequence of the controlled object measured by applying a first manipulated variable to the controlled object, and
determine, under a condition that a second response data sequence of the controlled object to be obtained in a case where a second manipulated variable data sequence, obtained by respectively multiplying the first manipulated variable by gains as variables which can vary with time, is applied to the controlled object, is expressed as a linear combination of the first response data sequence with the gains as coefficients of the linear combination, the gains so that a discrepancy between the expressed second response data sequence and a target data sequence falls within a tolerance,
wherein the feed-forward controller is configured to generate a feed-forward manipulated variable data sequence for the controlled object based on the determined gains and the first manipulated variable.

* * * * *